United States Patent
Kuwahara

(10) Patent No.: US 10,186,441 B2
(45) Date of Patent: Jan. 22, 2019

(54) SUBSTRATE PROCESSING APPARATUS AND SUBSTRATE PROCESSING METHOD

(71) Applicant: SCREEN Holdings Co., Ltd., Kyoto (JP)

(72) Inventor: Joji Kuwahara, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 102 days.

(21) Appl. No.: 15/512,307

(22) PCT Filed: Apr. 9, 2015

(86) PCT No.: PCT/JP2015/001995
§ 371 (c)(1),
(2) Date: Mar. 17, 2017

(87) PCT Pub. No.: WO2016/042685
PCT Pub. Date: Mar. 24, 2016

(65) Prior Publication Data
US 2017/0263483 A1    Sep. 14, 2017

(30) Foreign Application Priority Data

Sep. 17, 2014 (JP) ................................ 2014-189072

(51) Int. Cl.
*H01L 21/677* (2006.01)
*H01L 21/67* (2006.01)
(Continued)

(52) U.S. Cl.
CPC .. *H01L 21/67706* (2013.01); *H01L 21/67259* (2013.01); *H01L 21/67718* (2013.01);
(Continued)

(58) Field of Classification Search
None
See application file for complete search history.

(56) References Cited

U.S. PATENT DOCUMENTS 5,436,848 A * 7/1995 Nishida ............ H01L 21/67103
414/222.02
6,227,946 B1 * 5/2001 Gonzalez-Martin .... B24B 37/04
451/54
(Continued)

FOREIGN PATENT DOCUMENTS

JP   2004-015019 A   1/2004
JP   2006-351751 A   12/2006
(Continued)

OTHER PUBLICATIONS

International Search Report dated Jun. 23, 2015 in corresponding PCT International Application No. PCT/JP2015/001995.
(Continued)

Primary Examiner — Ramesh B Patel
(74) Attorney, Agent, or Firm — Ostrolenk Faber LLP

(57) ABSTRACT

During a position deviation detection operation, a hand of a transport mechanism is moved to a true target position in a substrate supporter. A substrate supported at a preset reference position by the substrate supporter is received by the hand of the transport mechanism. A positional relationship between the substrate received by the hand and the hand is detected by a position detector. A deviation amount between the reference position and the true target position in the substrate supporter is acquired based on the detected positional relationship. An alarm is output in the case where the acquired deviation amount is larger than a predetermined threshold value.

14 Claims, 23 Drawing Sheets

(51) Int. Cl.
*H01L 21/687* (2006.01)
*H01L 21/68* (2006.01)

(52) U.S. Cl.
CPC .. *H01L 21/67742* (2013.01); *H01L 21/67748* (2013.01); *H01L 21/681* (2013.01); *H01L 21/68707* (2013.01); *H01L 21/68764* (2013.01)

(56) References Cited

U.S. PATENT DOCUMENTS

| | | | | |
|---|---|---|---|---|
| 6,258,220 | B1* | 7/2001 | Dordi | C25D 17/06 |
| | | | | 204/198 |
| 9,508,573 | B2* | 11/2016 | Kashiyama | H01L 21/6715 |
| 2004/0037690 | A1* | 2/2004 | Kubo | B25J 15/103 |
| | | | | 414/741 |
| 2004/0073328 | A1* | 4/2004 | De Haas | H01L 21/67259 |
| | | | | 700/121 |
| 2004/0079633 | A1* | 4/2004 | Cheung | H01L 21/6708 |
| | | | | 204/242 |
| 2005/0016818 | A1 | 1/2005 | Ito et al. | 198/345.1 |
| 2005/0274207 | A1* | 12/2005 | Heo | H01L 21/67259 |
| | | | | 73/865.9 |
| 2007/0248439 | A1* | 10/2007 | Asari | H01L 21/67098 |
| | | | | 414/217 |
| 2010/0094452 | A1 | 4/2010 | Ogi | 700/228 |
| 2012/0257176 | A1 | 10/2012 | Hayashi | |
| 2012/0268742 | A1* | 10/2012 | Hatano | G01N 21/956 |
| | | | | 356/364 |
| 2013/0053997 | A1* | 2/2013 | Ohashi | H01L 21/67742 |
| | | | | 700/103 |
| 2013/0084393 | A1* | 4/2013 | Kashiyama | H01L 21/6715 |
| | | | | 427/273 |
| 2014/0023776 | A1 | 1/2014 | Kuwahara et al. | |
| 2015/0262848 | A1* | 9/2015 | Sano | H01L 21/6708 |
| | | | | 156/345.17 |
| 2016/0020125 | A1* | 1/2016 | Kuwahara | H01L 21/67028 |
| | | | | 414/222.02 |

FOREIGN PATENT DOCUMENTS

| | | |
|---|---|---|
| JP | 2008-141098 A | 6/2008 |
| JP | 2010-093169 A | 4/2010 |
| JP | 2012-222195 A | 11/2012 |
| JP | 2014-022589 A | 2/2014 |
| KR | 10-2004-0104421 | 12/2004 |
| KR | 10-2012-0115938 A | 10/2012 |

OTHER PUBLICATIONS

Decision to Grant a Patent dated Nov. 22, 2018 in counterpart Korean Patent Application No. 10-2017-7007456.

* cited by examiner

F I G. 7
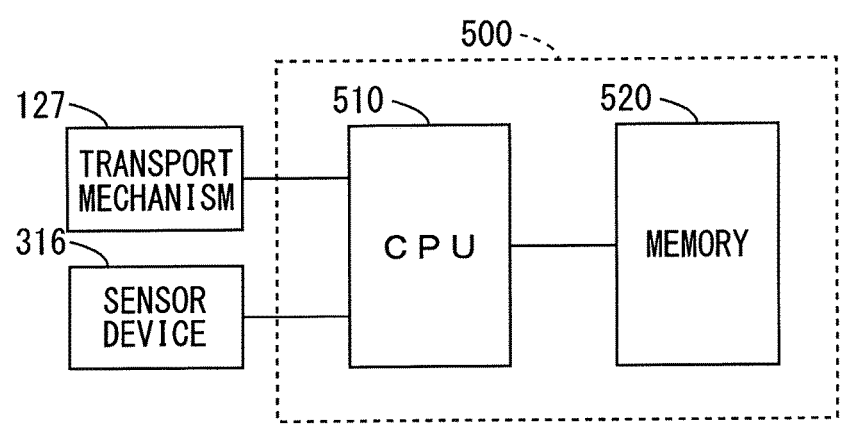

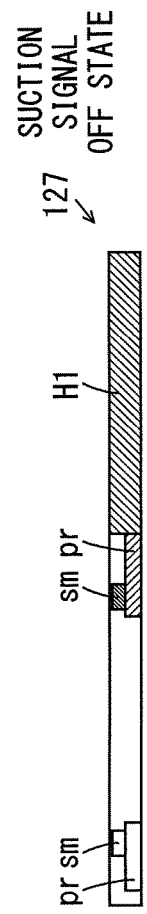
F I G. 8A
F I G. 8B
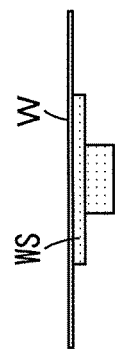
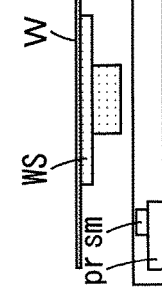
F I G. 8C
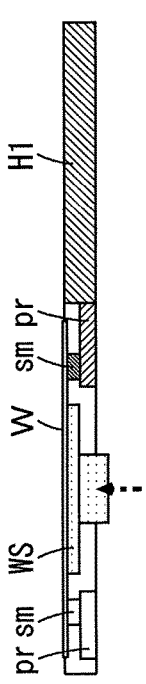
F I G. 8D FIG. 14A
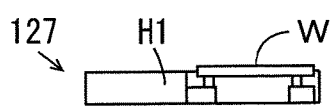 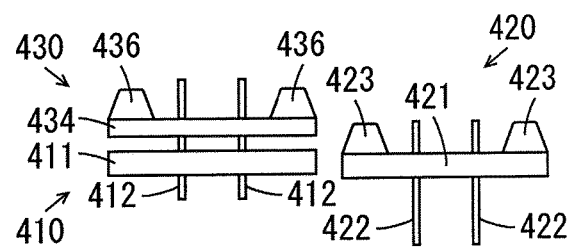
FIG. 14B
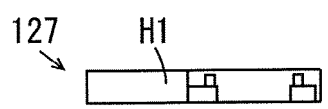 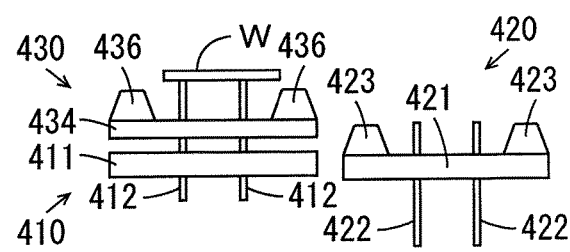
FIG. 14C
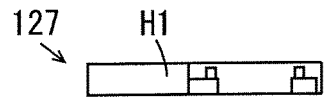 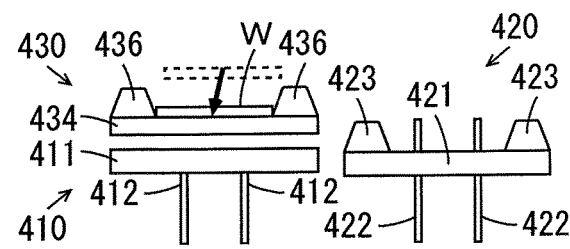
FIG. 14D
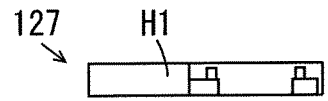 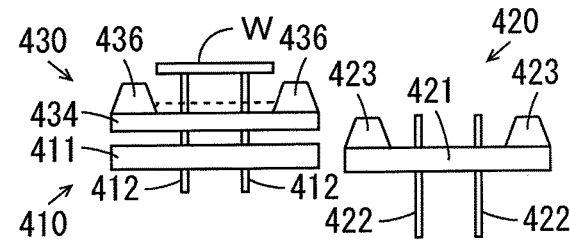
FIG. 14E
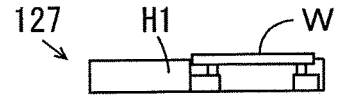 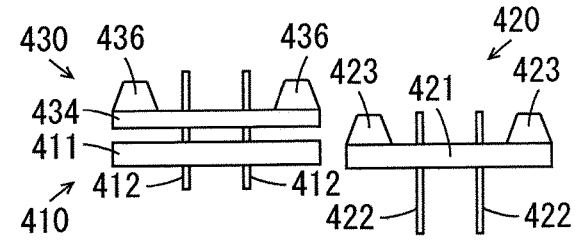

FIG. 23A
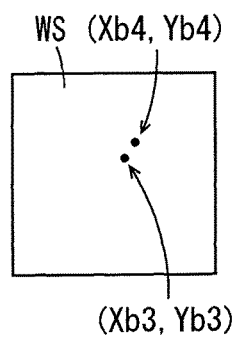 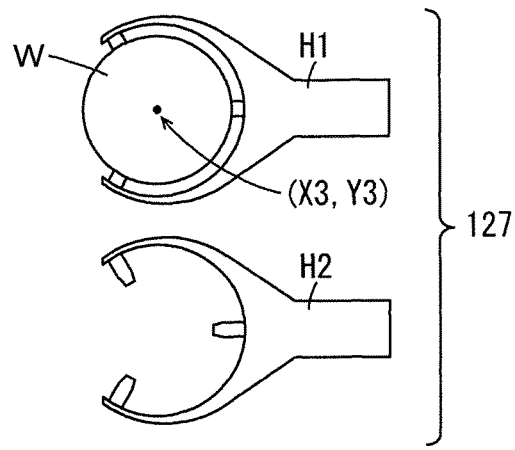
FIG. 23B
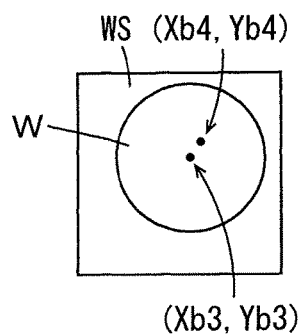 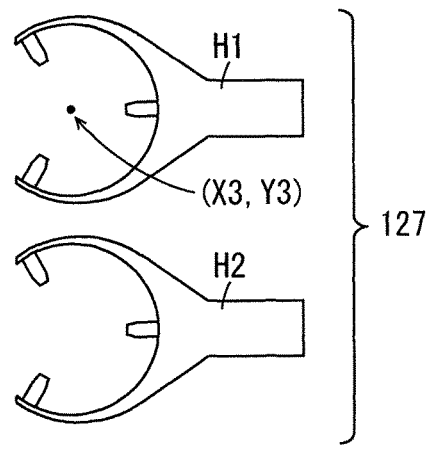
FIG. 23C
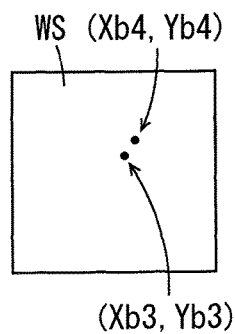 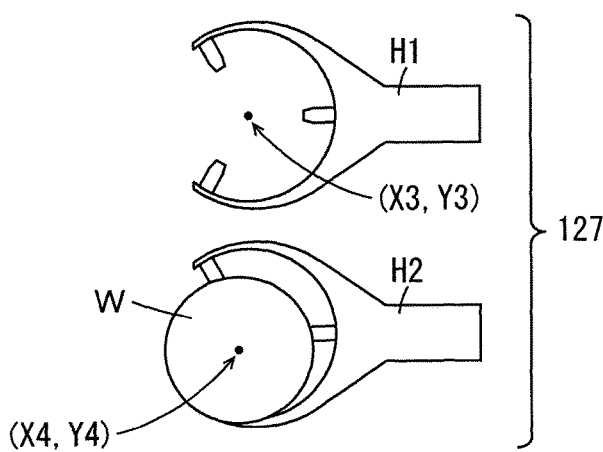

SUBSTRATE PROCESSING APPARATUS AND SUBSTRATE PROCESSING METHOD

CROSS-REFERENCE TO RELATED APPLICATIONS

The present application is a 35 U.S.C. §§ 371 national phase conversion of PCT/JP2015/001995, filed Apr. 9, 2015, which claims priority to Japanese Patent Application No. 2014-189072, filed Sep. 17, 2014, the contents of both of which are incorporated herein by reference. The PCT International Application was published in the Japanese language.

TECHNICAL FIELD

The present invention relates to a substrate processing apparatus and a substrate processing method.

BACKGROUND ART

Substrate processing apparatuses are used to subject various types of substrates such as semiconductor substrates, substrates for liquid crystal display devices, plasma displays, optical discs, magnetic discs, magneto-optical discs, and photomasks, and other substrates to various types of processing. In such a substrate processing apparatus, a plurality of substrates are sequentially transported to a predetermined substrate supporter in a processing section by a transport device. In the processing section, predetermined processing such as thermal processing, film formation processing or the like is performed on a substrate transported to the substrate supporter (See Patent Document 1, for example).

In the substrate processing apparatus described in Patent Document 1, a plurality of thermal processing sections stacked on a rail are provided to be movable between regular positions and retreating positions. The plurality of thermal processing sections are moved to the retreating positions during maintenance of the transport device and are moved to the normal positions during the substrate processing.

[Patent Document 1] JP 2004-15019 A

SUMMARY OF INVENTION

Technical Problem

As described in Patent Document 1, the processing section is configured to be movable, so that the maintenance is easily performed. However, a subtle position deviation sometimes occurs when the processing section is returned to the regular position after the maintenance. Thus, a position deviation of the substrate supporter in the processing section occurs. Further, the substrate supporter in the processing section is detached from the processing section during the maintenance, and then the substrate supporter is reattached to the processing section. Even in this case, a position deviation of the substrate supporter with respect to the processing section sometimes occurs. In the case where the substrate processing is performed with the position deviation of the substrate supporter present, accuracy of the substrate processing may be reduced.

An object of the present invention is to provide a substrate processing apparatus and a substrate processing method for preventing substrate processing from being performed with a position deviation of a substrate supporter present.

Solution to Problem (1) A substrate processing apparatus according to one aspect of the present invention that performs processing on a substrate includes a substrate supporter that has a preset reference position and is configured to be capable of supporting the substrate, a transport device that has a holder configured to hold the substrate and transports the substrate by moving the holder, a position detector that detects a positional relationship between the substrate held by the holder and the holder, and a controller that, during substrate processing, controls the transport device to move the holder to a target position in order for the substrate to be transferred to the reference position in the substrate supporter or received from the reference position, wherein the controller, during a position deviation detection operation, controls the transport device to move the holder to the target position in the substrate supporter and receive the substrate supported by the substrate supporter, acquires a deviation amount between the reference position and the target position based on the positional relationship detected by the position detector, and outputs an alarm in the case where the acquired deviation amount is larger than a predetermined first threshold value.

In this substrate processing apparatus, during the substrate processing, the holder of the transport device is moved to the target position. Thus, the substrate can be transferred to the substrate supporter by the holder such that the substrate is supported at the reference position, or the substrate supported at the reference position can be received. A position deviation of the substrate supporter sometimes occurs due to deterioration of a component over time, the attachment and detachment of the substrate supporter during the maintenance, or the like.

In the configuration of the present invention, the holder of the transport device is moved to the target position in the substrate supporter during the position deviation detection operation. Thus, the substrate supported by the substrate supporter at the reference position is received by the holder. A positional relationship between the substrate received by the holder and the holder is detected. A deviation amount between the reference position and the target position in the substrate supporter is acquired based on the detected positional relationship. An alarm is output in the case where the acquired deviation amount is larger than the predetermined first threshold value. Thus, an operator is notified of an occurrence of a position deviation of the substrate supporter. As a result, the substrate processing is prevented from being performed with the position deviation of the substrate supporter present.

(2) The substrate supporter may be configured to hold the substrate in a horizontal attitude and be rotatable about the reference position, and the controller, during the position deviation detection operation, may control the transport device to move the holder to the target position and transfer the substrate to the substrate supporter, may control the substrate supporter such that the substrate supported by the substrate supporter is rotated by a first angle, may control the transport device to move the holder to the target position and receive the substrate supported by the substrate supporter, and may acquire the reference position based on a positional relationship between the holder and the substrate before the substrate is transferred to the substrate supporter and a positional relationship between the holder and the substrate after the substrate is received from the substrate supporter.

In this case, during the position deviation detection operation, the holder of the transport device transfers the substrate to the substrate supporter and receives the rotated substrate, whereby the reference position is acquired. Thus, the reference position can be acquired with a simple operation.

(3) The controller, during a teaching operation relating to the transport device, may control the transport device to move the holder to an initial position in the substrate supporter and transfer the substrate to the substrate supporter, may control the substrate supporter such that the substrate supported by the substrate supporter is rotated by a second angle, may control the transport device to move the holder to the initial position and receive the substrate supported by the substrate supporter, may acquire a deviation amount between the initial position and the reference position as correction information based on a positional relationship between the holder and the substrate before the substrate is transferred to the substrate supporter, and a positional relationship between the holder and the substrate after the substrate is received from the substrate supporter, may correct the initial position based on the acquired correction information such that the initial position coincides with the reference position, and may acquire a corrected initial position as the target position.

In this case, during the teaching operation relating to the transport device, the holder of the transport device transfers the substrate to the substrate supporter and receives the rotated substrate, whereby the initial position is corrected to the target position. Thus, the target position can be acquired with a simple operation.

(4) The substrate processing apparatus may further include a processing unit that includes the substrate supporter and performs processing on the substrate rotated by the substrate supporter during the substrate processing.

In this case, the processing is performed on the substrate rotated by the substrate supporter with the center of the substrate coinciding with the reference position in the substrate supporter. Thus, the accuracy of the processing of the substrate can be improved.

(5) The controller, during the position deviation detection operation, may control the transport device to move the holder to the target position and receive the substrate supported at the reference position in the substrate supporter, and may acquire the reference position based on the positional relationship detected by the position detector.

In this case, during the position deviation detection operation, the holder of the transport device receives the substrate supported by the substrate supporter at the reference position in the substrate supporter, whereby the reference position is acquired. Thus, the reference position can be acquired by a simple operation.

(6) The controller, during a teaching operation relating to the transport device, may control the transport device to move the holder to an initial position in the substrate supporter and receive the substrate supported at the reference position in the substrate supporter, may acquire a deviation amount between the initial position and the reference position as correction information based on the positional relationship detected by the position detector, may correct the initial position based on the acquired correction information such that the initial position coincides with the reference position, and may acquire a corrected initial position as the target position.

In this case, during the teaching operation relating to the transport device, the holder of the transport device receives the substrate supported at the reference position in the substrate supporter, whereby the initial position is corrected to the target position. Thus, the target position can be acquired with a simple operation.

(7) The substrate supporter may include a guide mechanism that guides the substrate to the reference position, and the substrate may be guided to the reference position in the substrate supporter by the guide mechanism during the teaching operation.

In this case, the substrate is guided to the horizontal reference position by the guide mechanism. Thus, during the teaching operation, it is unnecessary for the operator to position the substrate at the reference position. Therefore, a burden on the operator is more sufficiently reduced. Further, also during the substrate processing, the substrate is accurately positioned at the reference position in the substrate supporter by the guide mechanism.

(8) The substrate processing apparatus may further include a processing unit that includes the substrate supporter and performs processing on the substrate supported by the substrate supporter during the substrate processing, wherein the target position may be set in the processing unit, and the controller may control the transport device to move the holder to the target position in the processing unit and receive the substrate supported at the reference position in the processing unit.

In this case, the substrate is supported at the reference position in the processing unit. Thus, the processing is performed on the substrate supported by the substrate supporter with the center of the substrate coinciding with the reference position. Thus, the accuracy of the processing of the substrate can be improved.

(9) The holder of the transport device may have a holding surface for holding a lower surface of the substrate, the substrate processing apparatus may further include a holding detector detecting that the holding surface of the holder has held the lower surface of the substrate, and the controller, during the position deviation detection operation, may control the transport device to lift the holder from a target height lower than the substrate supported by the substrate supporter at a reference height, may acquire a height of the holder at a time point of detection by the holding detector, may acquire a deviation amount in distance between the holding surface in the case where the holder is positioned at the target height and the reference height based on the acquired height, and may output an alarm in the case where the acquired deviation amount is larger than a second threshold value.

In this configuration, an alarm is output in the case where a deviation amount in distance between the holding surface in the case where the holder is positioned at the target height and the reference height is larger than a threshold value. Thus, the operator is notified of an occurrence of a position deviation of the substrate supporter or wear of the holding surface of the holder. As a result, the substrate processing is prevented from being performed with the position deviation of the substrate supporter present, and the substrate is prevented from being transferred with the holding surface of the holder worn away.

(10) A substrate processing apparatus according to another aspect of the present invention that performs processing on a substrate includes a substrate supporter configured to be capable of supporting the substrate, a transport device that includes a holder having a holding surface for holding a lower surface of the substrate and transports the substrate by moving the holder, a holding detector detecting that the holding surface of the holder has held the lower surface of the substrate, and a controller that, during substrate processing, controls the transport device to move the holder in order for the substrate to be transferred to the substrate supporter or received from the substrate supporter, wherein the controller, during a position deviation detection operation, controls the transport device to lift the holder from a target height lower than the substrate supported by the substrate supporter at a reference height, acquires a height of the holder at a time point of detection by the holding detector, acquires a deviation amount in distance between the holding surface in the case where the holder is positioned at the target height and the reference height based on the acquired height, and outputs an alarm in the case where the acquired deviation amount is larger than a threshold value.

In this substrate processing apparatus, during the substrate processing, the holder of the transport device is moved to the target height and then lifted. Thus, the substrate can be transferred to the substrate supporter by the holder such that the substrate is supported at the reference height, or the substrate supported at the reference height can be received. A deviation in distance between the holding surface in the case where the holder is positioned at the target height and the reference height may occur due to deterioration of a component over time, the detachment and attachment of the substrate supporter during the maintenance, or the like.

In the configuration of the present invention, during the position deviation detection operation, the holder of the transport device is lifted from the target height lower than the substrate supported by the substrate holder at the reference height. Thus, it is detected that the holding surface of the holder has held the lower surface of the substrate. The height of the holder at a time point of detection of the substrate is acquired. A deviation amount in distance between the holding surface in the case where the holder is positioned at the target height and the reference height is acquired based on the acquired height. An alarm is output in the case where the acquired deviation amount is larger than the threshold value.

Thus, the operator is notified of an occurrence of the position deviation of the substrate supporter or wear of the holding surface of the holder. As a result, the substrate processing is prevented from being performed with the position deviation of the substrate supporter present, and the substrate is prevented from being transported with the holding surface of the holder worn away.

(11) The controller, during a teaching operation relating to the transport device, may control the transport device to lift the holder from a position lower than the substrate supported by the substrate supporter at the reference height, and may acquire the target height based on the height of the holder at the time point of detection by the holding detector.

In this case, during the teaching operation relating to the transport device, the holder of the transport device detects the lower surface of the substrate supported by the substrate supporter at the reference height from below, whereby the target height is acquired. Therefore, the target height can be acquired with a simple operation.

(12) The holder may include a suction portion that sucks the lower surface of the substrate, the suction portion may have the holding surface, and the holding detector may be configured to detect that the holding surface has held the lower surface of the substrate based on whether the substrate is sucked by the suction portion.

In this case, it is possible to detect that the holder has held the lower surface of the substrate with a simple configuration. Further, the holder can reliably hold the substrate.

(13) A substrate processing method according to yet another aspect of the present invention for performing processing on a substrate includes the steps of moving a holder of a transport device to a target position in order for the substrate to be transferred to a preset reference position in a substrate supporter or received from the reference position during substrate processing, moving the holder of the transport device to the target position in the substrate supporter and receiving the substrate supported by the substrate supporter at the reference position, during a position deviation detection operation, detecting a positional relationship between the substrate received by the holder and the holder, acquiring a deviation amount between the reference position and the target position in the substrate supporter based on the detected positional relationship, and outputting an alarm in the case where the acquired deviation amount is larger than a predetermined threshold value.

According to this substrate processing method, during the substrate processing, the holder of the transport device is moved to the target position. Thus, the substrate can be transferred to the substrate supporter by the holder such that the substrate is supported at the reference position, or the substrate supported at the reference position can be received. A position deviation of the substrate supporter may occur due to deterioration of a component over time, the detachment and attachment of the substrate supporter during the maintenance, or the like.

According to the method of the present invention, during the position deviation detection operation, the holder of the transport device is moved to the target position in the substrate supporter. Thus, the substrate supported at the reference position by the substrate supporter is received by the holder. A positional relationship between the substrate received by the holder and the holder is detected. A deviation amount between the reference position and the target position in the substrate supporter is acquired based on the detected positional relationship. An alarm is output in the case where the acquired deviation amount is larger than a predetermined first threshold value. Thus, the operator is notified of an occurrence of a position deviation of the substrate supporter. As a result, the substrate processing is prevented from being performed with the position deviation of the substrate supporter present.

(14) A substrate processing method according to yet another aspect of the present invention for performing processing on a substrate includes the steps of moving a holder of a transport device in order for the substrate to be transferred to a substrate supporter and received from the substrate supporter during substrate processing, lifting the holder of the transport device from a target height lower than the substrate supported by the substrate supporter at a reference height during a position deviation detection operation, detecting that a holding surface of the holder has held a lower surface of the substrate, acquiring a height of the holder at a time point of detection of the substrate, acquiring a deviation amount in distance between the holding surface in the case where the holder is positioned at the target height and the reference height based on the acquired height, and outputting an alarm in the case where the acquired deviation amount is larger than a threshold value.

According to this substrate processing method, during the substrate processing, the holder of the transport device is moved to the target height and then lifted. Thus, the substrate can be transferred to the substrate supporter by the holder such that the substrate is supported at the reference height, or the substrate supported at the reference height can be received. A deviation in distance between the holding surface in the case where the holder is positioned at the target height and the reference height sometimes occurs due to deterioration of a component over time, the detachment and attachment of the substrate supporter during the maintenance, or the like.

According to the method of the present invention, during the position deviation detection operation, the holder of the transport device is lifted from the target height lower than the substrate supported by the substrate supporter at the reference height. Thus, it is detected that the holding surface of the holder has held the lower surface of the substrate. The height of the holder at a time point of detection of the substrate is acquired. A deviation amount in distance between the holding surface in the case where the holder is positioned at the target height and the reference height is acquired based on the acquired height. An alarm is output in the case where the acquired deviation amount is larger than the threshold value.

Thus, the operator is notified of an occurrence of a position deviation of the substrate supporter or wear of the holding surface of the holder. As a result, the substrate processing is prevented from being performed with the position deviation of the substrate supporter present, and the substrate is prevented from being transported with the holding surface of the holder worn away.

Advantageous Effects of Invention

The present invention enables the substrate processing to be prevented from being performed with a position deviation of the substrate supporter present.

BRIEF DESCRIPTION OF DRAWINGS

FIG. 7 is a block diagram showing a configuration of a control system of the transport mechanism.

FIGS. 8A to 8D are diagrams for explaining a teaching operation in a vertical direction.

FIGS. 14A to 14E are diagrams for explaining a reference position in the case where a substrate supporter is provided in the thermal processing unit.

FIGS. 23A to 23C are diagrams for explaining steps of acquiring correction information about another hand in another embodiment.

DESCRIPTION OF EMBODIMENTS

A substrate processing apparatus and a substrate processing method according to one embodiment of the present invention will be described below with reference to drawings. In the following description, a substrate refers to a semiconductor substrate, a substrate for a liquid crystal display device, a substrate for a plasma display, a substrate for an optical disc, a substrate for a magnetic disc, a substrate for a magneto-optical disc, a substrate for a photomask or the like.

(1) Configuration of Substrate Processing Apparatus

Figure 1:
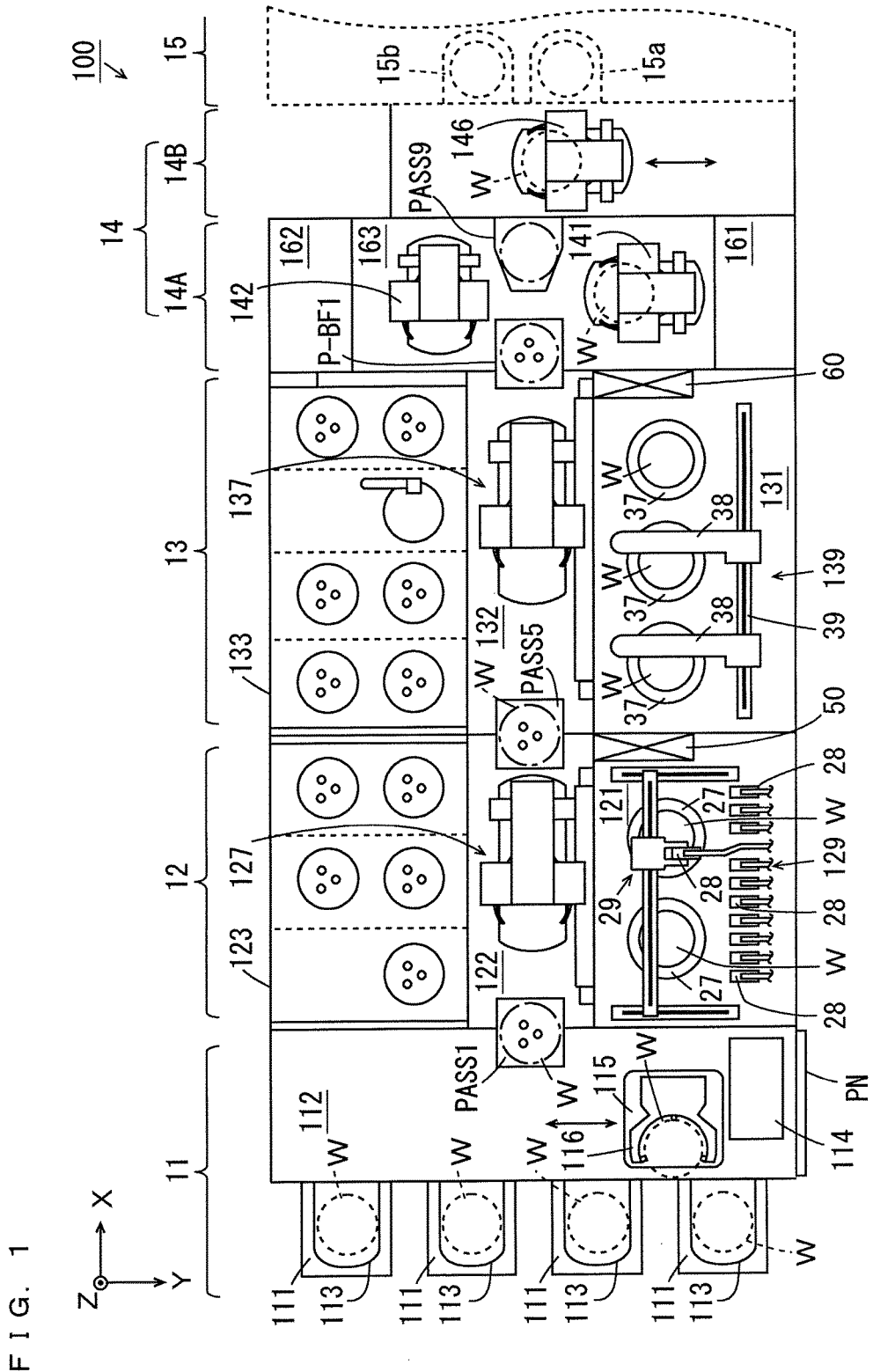
FIG. 1 is a schematic plan view of a substrate processing apparatus according to one embodiment of the present invention.

FIG. 1 is a schematic plan view of the substrate processing apparatus according to the one embodiment of the present invention.

FIG. 1 and the subsequent drawings are accompanied by arrows that indicate X, Y, and Z directions orthogonal to one another for the clarity of a positional relationship. The X and Y directions are orthogonal to each other within a horizontal plane, and the Z direction corresponds to a vertical direction.

As shown in FIG. 1, the substrate processing apparatus 100 includes an indexer block 11, a first processing block 12, a second processing block 13, a cleaning drying processing block 14A and a carry-in carry-out block 14B. An interface block 14 is constituted by the cleaning drying processing block 14A and the carry-in carry-out block 14B. An exposure device 15 is arranged to be adjacent to the carry-in carry-out block 14B. In the exposure device 15, exposure processing is performed on a substrate W by a liquid immersion method.

As shown in FIG. 1, the indexer block 11 includes a plurality of carrier platforms 111 and a transport section 112. In each carrier platform 111, a carrier 113 for storing the plurality of substrates W in multiple stages is placed.

In the transport section 112, a controller 114 and a transport mechanism 115 are provided. The controller 114 controls various constituent elements of the substrate processing apparatus 100. The transport mechanism 115 has a hand 116 for holding the substrate W. The transport mechanism 115 holds and transports the substrate W using the hand 116.

A main panel PN is provided on a side surface of the transport section 112. The main panel PN is connected to the controller 114. A user can confirm the processing status of the substrate W in the substrate processing apparatus 100 and other pieces of information on the main panel PN. An operation unit (not shown) including a keyboard, for example, is provided in the vicinity of the main panel PN. The user can make operation settings or the like of the substrate processing apparatus 100 by operating the operation unit.

The first processing block 12 includes a coating processing section 121, a transport section 122 and a thermal processing section 123. The thermal processing section 123 is provided to be movable. During substrate processing, the thermal processing section 123 is arranged to be opposite to the coating processing section 121 with the transport section 122 sandwiched therebetween. The position of the thermal processing section 123 in this case is referred to as a regular position. On the other hand, during maintenance of the substrate processing apparatus 100, the thermal processing section 123 is arranged at a position spaced apart from the regular position. The position of the thermal processing section 123 in this case is referred to as a maintenance position. Thus, a work space can be ensured. In the following description of the substrate processing apparatus 100, the thermal processing section 123 is arranged at the regular position.

A substrate platform PASS1 and substrate platforms PASS2 to PASS4 (see FIG. 4) that are described below on which the substrates W are placed are provided between the transport section 122 and the indexer block 11. A transport mechanism 127 and a transport mechanism 128 (see FIG. 4) that is described below, which transport the substrates W, are provided in the transport section 122.

The second processing block 13 includes a development processing section 131, a transport section 132 and a thermal processing section 133. The thermal processing section 133 is provided to be movable. During the substrate processing, the thermal processing section 133 is arranged to be opposite to the development processing section 131 with the transport section 132 sandwiched therebetween. The position of the thermal processing section 133 in this case is referred to as a regular position. On the other hand, during maintenance of the substrate processing apparatus 100, the thermal processing section 133 is arranged at a position spaced apart from the regular position. The position of the thermal processing section 133 in this case is referred to as a maintenance position. In the following description of the substrate processing apparatus 100, the thermal processing section 133 is arranged at the regular position.

A substrate platform PASS5 and substrate platforms PASS6 to PASS8 (see FIG. 4) that are described below on which the substrates W are placed are provided between the transport section 132 and the transport section 122. A transport mechanism 137 and a transport mechanism 138 (see FIG. 4) that is described below, which transport the substrates W, are provided in the transport section 132.

The cleaning drying processing block 14A includes cleaning drying processing sections 161, 162 and a transport section 163. The cleaning drying processing sections 161, 162 are provided to be opposite to each other with the transport section 163 sandwiched therebetween. In the transport section 163, transport mechanisms 141, 142 are provided.

A placement buffer unit P-BF1, and a placement buffer unit P-BF2 (see FIG. 4) that is described below are provided between the transport section 163 and the transport section 132. The placement buffer units P-BF1, P-BF2 are configured to be capable of storing the plurality of substrates W.

Further, a substrate platform PASS9, and placement cooling units P-CP (see FIG. 4) that are described below are provided to be adjacent to the carry-in carry-out block 14B between the transport mechanisms 141, 142. In the placement cooling unit P-CP, the substrate W is cooled to a temperature suitable for exposure processing.

A transport mechanism 146 is provided in the carry-in carry-out block 14B. The transport mechanism 146 carries in the substrate W to and carries out the substrate W from the exposure device 15. A substrate inlet 15a for carrying in the substrate W and a substrate outlet 15b for carrying out the substrate W are provided in the exposure device 15.

Figure 2:
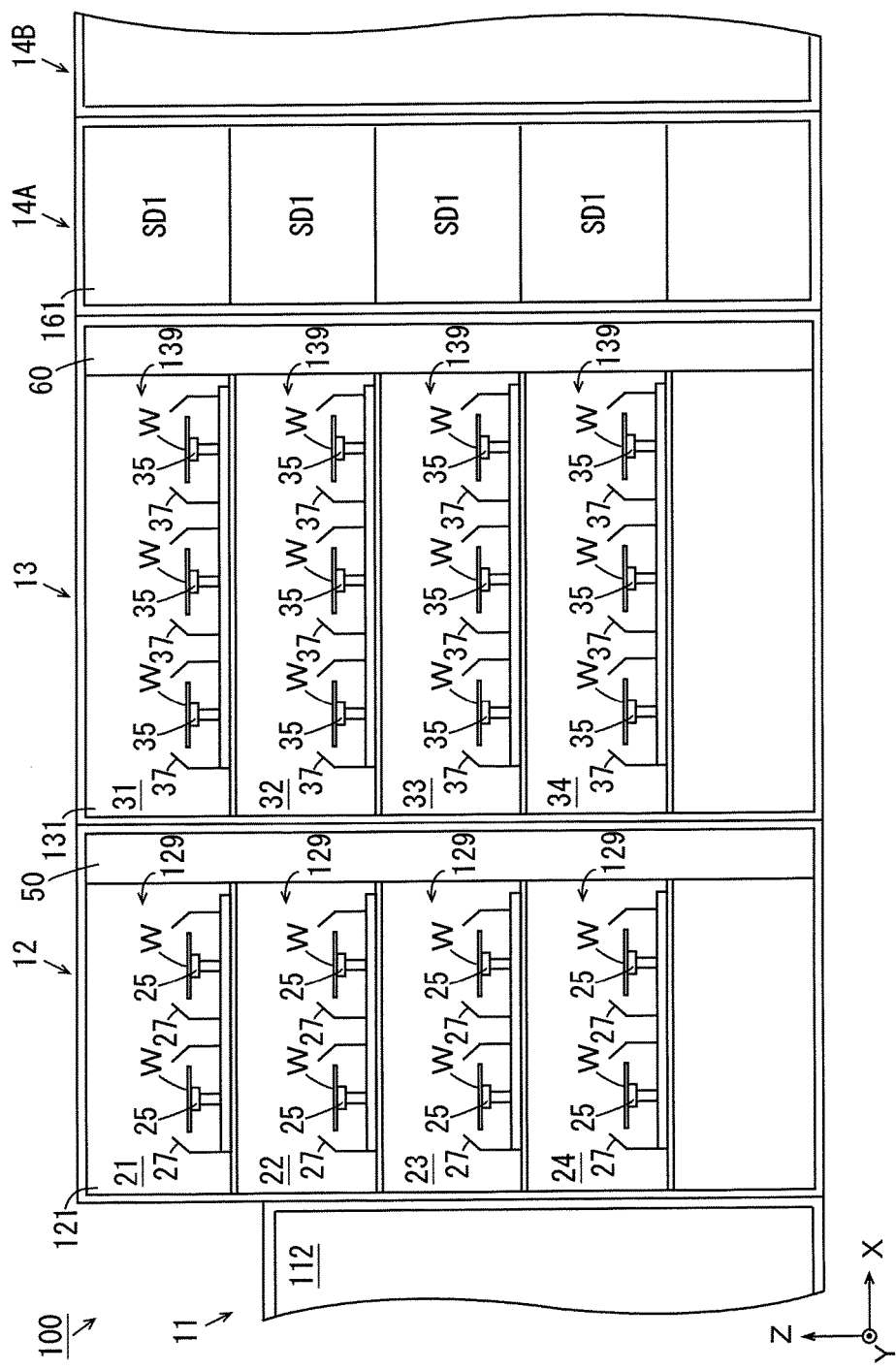
FIG. 2 is a schematic side view of the substrate processing apparatus mainly showing a coating processing section, a development processing section and a cleaning drying processing section of FIG. 1.

(2) Configurations of Coating Processing Section and Development Processing Section FIG. 2 is a schematic side view of the substrate processing apparatus 100 mainly showing the coating processing section 121, the development processing section 131 and the cleaning drying processing section 161 of FIG. 1.

As shown in FIG. 2, in the coating processing section 121, coating processing chambers 21, 22, 23, 24 are provided in a stack. In the development processing section 131, development processing chambers 31, 32, 33, 34 are provided in a stack. In each of the coating processing chambers 21 to 24, a coating processing unit 129 is provided. In each of the development processing chambers 31 to 34, a development processing unit 139 is provided.

Each coating processing unit 129 includes spin chucks 25 that hold the substrate W and cups 27 provided to cover the surroundings of the spin chuck 25. In the present embodiment, two sets of the spin chuck 25 and the cup 27 are provided in each coating processing unit 129. The spin chuck 25 is provided to be attachable to and detachable from a driving device (not shown) (an electric motor, for example). During the substrate processing, the rotation of the spin chuck 25 is driven by the driving device. On the other hand, during the maintenance, the spin chuck 25 is detached from the driving device. Further, as shown in FIG. 1, each coating processing unit 129 includes a plurality of processing liquid nozzles 28 that discharge a processing liquid and a nozzle transport mechanisms 29 that moves these processing liquid nozzles 28.

In each coating processing unit 129, the spin chuck 25 is rotated by the driving device (not shown), and any processing liquid nozzle 28 among the plurality of processing liquid nozzles 28 is moved to a position above the substrate W by the nozzle transport mechanism 29, and a processing liquid is discharged from the processing liquid nozzle 28. Thus, the processing liquid is applied to the upper surface of the substrate W. Further, a rinse liquid is discharged to a peripheral portion of the substrate W from an edge rinse nozzle (not shown). Thus, a processing liquid adhering to the peripheral portion of the substrate W is removed.

In the coating processing unit 129 in each of the coating processing chambers 22, 24, a processing liquid for an anti-reflection film is supplied to the substrate W from the processing liquid nozzle 28. In the coating processing unit 129 in each of the coating processing chambers 21, 23, a processing liquid for a resist film is supplied to the substrate W from the processing liquid nozzle 28.

The development processing unit 139 includes spin chucks 35 and cups 37 similarly to the coating processing unit 129. Further, as shown in FIG. 1, the development processing unit 139 includes two development nozzles 38 that discharge a development liquid and a moving mechanism 39 that moves these development nozzles 38 in the X direction.

In the development processing unit 139, each spin chuck 35 is rotated by a driving device (not shown), one development nozzle 38 supplies a development liquid to each substrate W while moving in the X direction, and then the other development nozzle 38 supplies a development liquid to each substrate W while moving. In this case, the development processing of the substrate W is performed when the development liquid is supplied to the substrate W. Further, in the present embodiment, the development liquids different from each other are respectively discharged from the two development nozzles 38. Thus, two types of the development liquids can be supplied to each substrate W.

A plurality (four in the present example) of cleaning drying processing units SD1 are provided in the cleaning drying processing section 161. In each cleaning drying processing unit SD1, cleaning and drying processing of the substrate W before the exposure processing is performed.

As shown in FIGS. 1 and 2, a fluid box 50 is provided in the coating processing section 121 to be adjacent to the development processing section 131. Similarly, a fluid box 60 is provided in the development processing section 131 to be adjacent to the cleaning drying processing block 14A. The fluid box 50 and the fluid box 60 each house fluid related elements such as pipes, joints, valves, flowmeters, regulators, pumps and temperature adjusters used to supply a chemical liquid to the coating processing units 129 and the development processing units 139, discharge the liquid and air out of the coating processing units 129 and the development processing units 139.

(3) Configuration of Thermal Processing Sections

Figure 3:
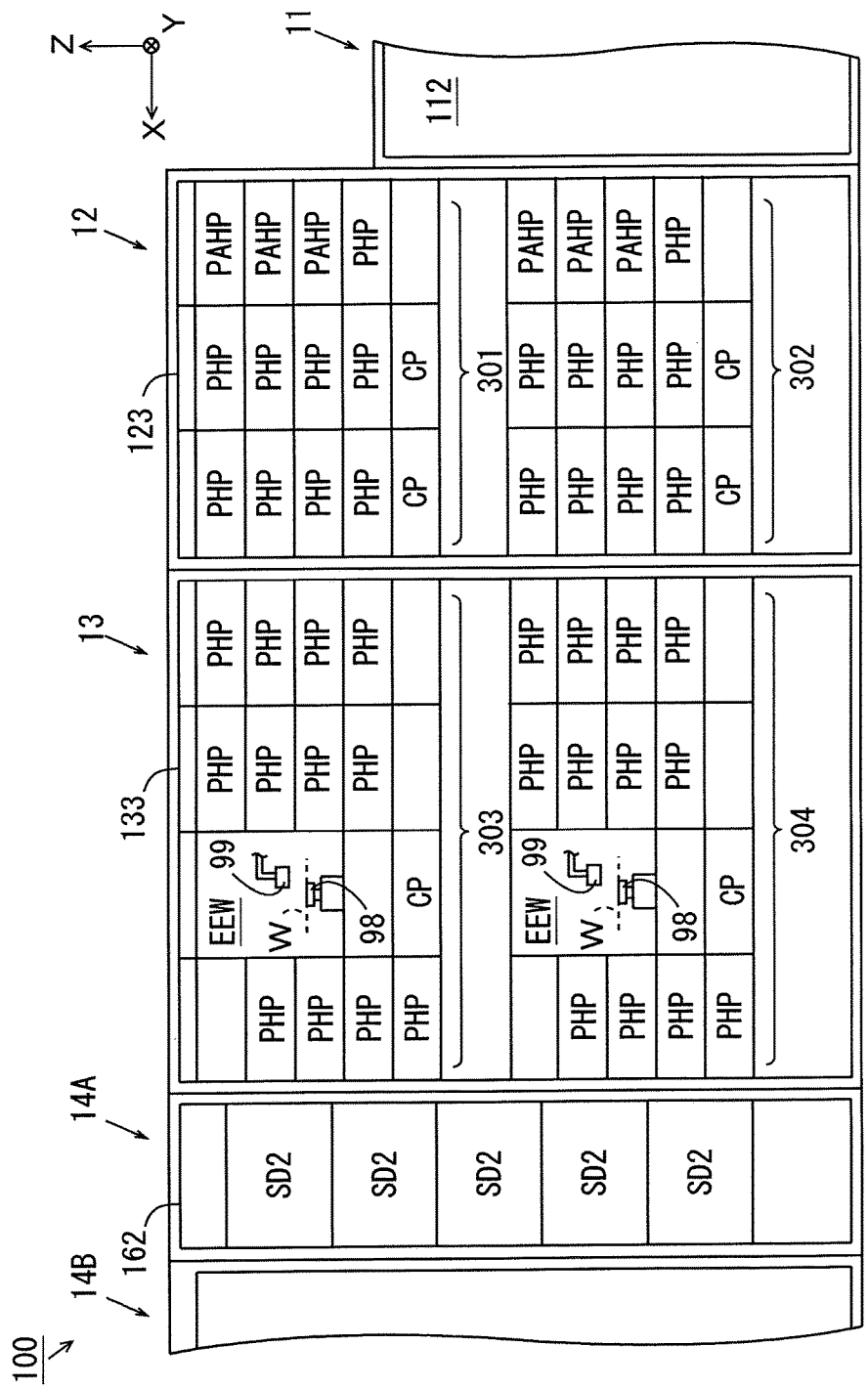
FIG. 3 is a schematic side view of the substrate processing apparatus mainly showing thermal processing sections and the cleaning drying processing section of FIG. 1.

FIG. 3 is a schematic side view of the substrate processing apparatus 100 mainly showing the thermal processing sections 123, 133 and the cleaning drying processing section 162 of FIG. 1. As shown in FIG. 3, the thermal processing section 123 has an upper thermal processing section 301 provided above, and a lower thermal processing section 302 provided below. In each of the upper thermal processing section 301 and the lower thermal processing section 302, a plurality of thermal processing units PHP, a plurality of adhesion reinforcement processing units PAHP and a plurality of cooling units CP are provided.

In each thermal processing unit PHP, heating processing of the substrate W is performed. In the adhesion reinforcement processing unit PAHP, adhesion reinforcement processing for improving adhesion between the substrate W and the anti-reflection film is performed. Specifically, in the adhesion reinforcement processing unit PAHP, an adhesion reinforcement agent such as HMDS (hexamethyldisilazane) is applied to the substrate W, and the heating processing is performed on the substrate W. In each cooling unit CP, the cooling processing of the substrate W is performed.

The thermal processing section 133 has an upper thermal processing section 303 provided above and a lower thermal processing section 304 provided below. In each of the upper thermal processing section 303 and the lower thermal processing section 304, a cooling unit CP, a plurality of thermal processing units PHP and an edge exposure unit EEW are provided.

Each edge exposure unit EEW includes a spin chuck 98 that holds the substrate W by suction in a horizontal attitude while rotating the same, and a light emitting device 99 that exposes the outer peripheral portion of the substrate W held on the spin chuck 98. The spin chuck 98 is provided to be attachable to and detachable from the driving device (not shown) (an electric motor, for example). During the substrate processing, the rotation of the spin chuck 98 is driven by the driving device. On the other hand, during the maintenance, the spin chuck 98 is detached from the driving device.

In the edge exposure unit EEW, exposure processing (edge exposure processing) is performed on a region with a constant width at the peripheral portion of the resist film formed on the substrate W. In the upper thermal processing section 303 and the lower thermal processing section 304, each thermal processing unit PHP provided to be adjacent to the cleaning drying processing block 14A is configured to be capable of carrying in the substrate W from the cleaning drying processing block 14A.

A plurality (five in the present example) of cleaning drying processing units SD2 are provided in the cleaning drying processing section 162. In each cleaning drying processing unit SD2, the cleaning and drying processing of the substrate W after the exposure processing is performed.

(4) Configuration of Transport Sections

Figure 4:
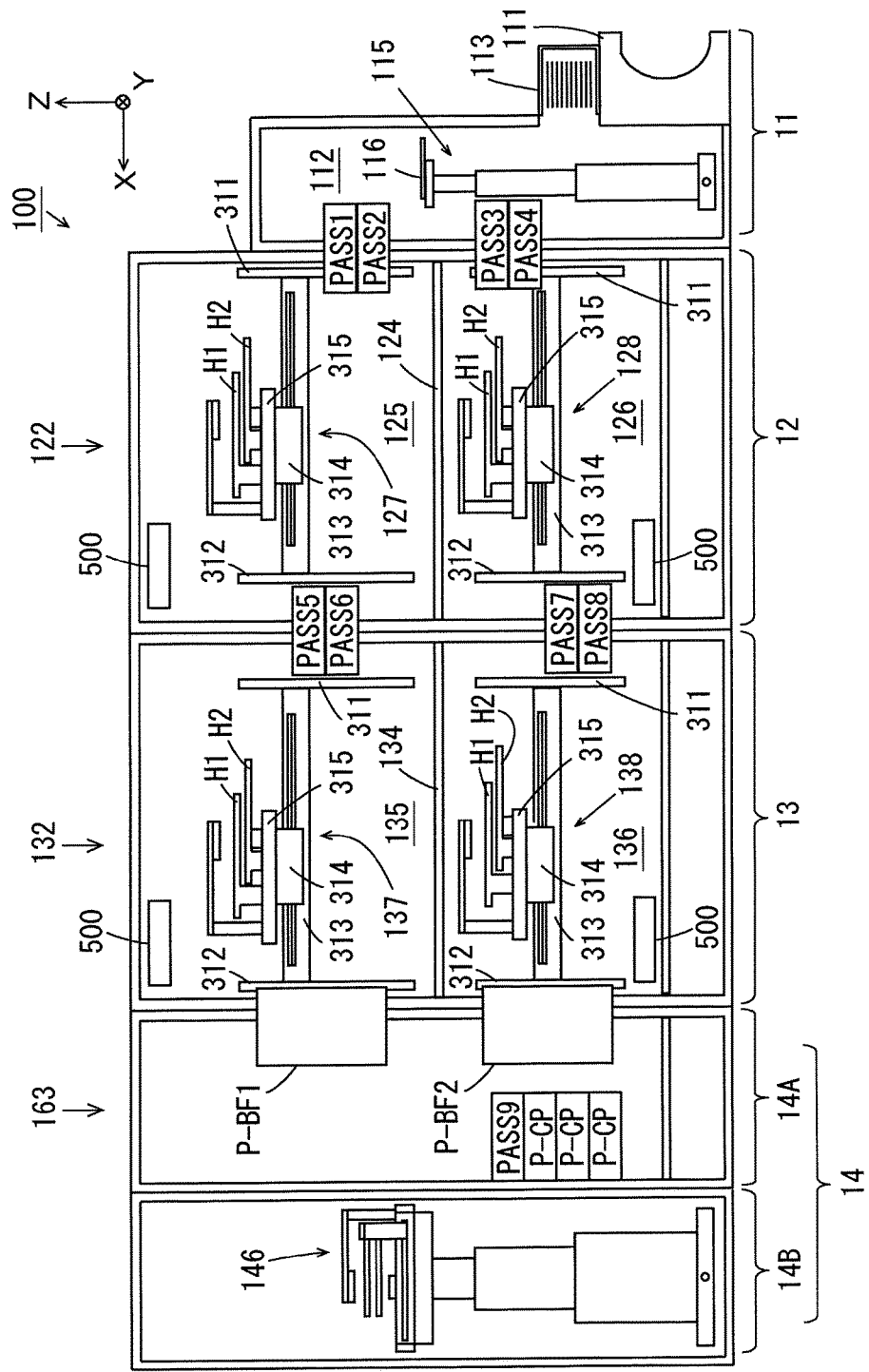
FIG. 4 is a side view mainly showing transport sections of FIG. 1.

FIG. 4 is a side view mainly showing the transport sections 122, 132, 163 of FIG. 1. As shown in FIG. 4, the transport section 122 has an upper transport chamber 125 and a lower transport chamber 126. The transport section 132 has an upper transport chamber 135 and a lower transport chamber 136. The transport mechanism 127 is provided in the upper transport chamber 125, and the transport mechanism 128 is provided in the lower transport chamber 126. Further, the transport mechanism 137 is provided in the upper transport chamber 135, and the transport mechanism 138 is provided in the lower transport chamber 136.

As shown in FIG. 4, the substrate platforms PASS1, PASS2 are provided between the transport section 112 and the upper transport chamber 125, and the substrate platforms PASS3, PASS4 are provided between the transport section 112 and the lower transport chamber 126. The substrate platforms PASS5, PASS6 are provided between the upper transport chamber 125 and the upper transport chamber 135, and the substrate platforms PASS7, PASS8 are provided between the lower transport chamber 126 and the lower transport chamber 136.

The placement buffer unit P-BF1 is provided between the upper transport chamber 135 and the transport section 163, and the placement buffer unit P-BF2 is provided between the lower transport chamber 136 and the transport section 163. The substrate platform PASS9 and the plurality of placement cooling platforms P-CP are provided to be adjacent to the carry-in carry-out block 14B in the transport section 163.

The transport mechanism 127 is configured to be capable of transporting the substrate W among the substrate platforms PASS1, PASS2, PASS5, PASS6, the coating processing chambers 21, 22 (FIG. 2) and the upper thermal processing section 301 (FIG. 3). The transport mechanism 128 is configured to be capable of transporting the substrate W among the substrate platforms PASS3, PASS4, PASS7, PASS8, the coating processing chambers 23, 24 (FIG. 2) and the lower thermal processing section 302 (FIG. 3).

The transport mechanism 137 is configured to be capable of transporting the substrate W among the substrate platforms PASS5, PASS6, the placement buffer unit P-BF1, the development processing chambers 31, 32 (FIG. 2) and the upper thermal processing section 303 (FIG. 3). The transport mechanism 138 is configured to be capable of transporting the substrate W among the substrate platforms PASS7, PASS8, the placement buffer unit P-BF2, the development processing chambers 33, 34 (FIG. 2) and the lower thermal processing section 304 (FIG. 3).

A plurality of controllers 500 that respectively control the transport mechanisms 127, 128, 137, 138 are provided in the transport sections 122, 132. Part of or all of the plurality of controllers 500 may be realized by the controller 114 of FIG. 1.

(5) Operation of Substrate Processing Apparatus

The operation of the substrate processing apparatus 100 will be described with reference to FIGS. 1 to 4. The carrier 113 in which the unprocessed substrates W are stored is placed on the carrier platform 111 (FIG. 1) in the indexer block 11. The transport mechanism 115 transports the unprocessed substrate W from the carrier 113 to each of the substrate platforms PASS1, PASS3 (FIG. 4). Further, the transport mechanism 115 transports the processed substrate W that is placed on each of the substrate platforms PASS2, PASS4 (FIG. 4) to the carrier 113.

In the first processing block 12, the transport mechanism 127 (FIG. 4) sequentially transports the substrate W placed on the substrate platform PASS1 to the adhesion reinforcement processing unit PAHP (FIG. 3), the cooling unit CP (FIG. 3) and the coating processing chamber 22 (FIG. 2). Next, the transport mechanism 127 sequentially transports the substrate W on which the anti-reflection film is formed by the coating processing chamber 22 to the thermal processing unit PHP (FIG. 3), the cooling unit CP (FIG. 3) and the coating processing chamber 21 (FIG. 2). Then, the transport mechanism 127 sequentially transports the substrate W on which the resist film is formed by the coating processing chamber 21 to the thermal processing unit PHP (FIG. 3) and the substrate platform PASS5 (FIG. 4).

In this case, the adhesion reinforcement processing is performed on the substrate W in the adhesion reinforcement processing unit PAHP, and then the substrate W is cooled to a temperature suitable for formation of the anti-reflection film in the cooling unit CP. Next, in the coating processing chamber 22, the anti-reflection film is formed on the substrate W by the coating processing unit 129 (FIG. 2). Subsequently, the thermal processing of the substrate W is performed in the thermal processing unit PHP, and then the substrate W is cooled to a temperature suitable for the formation of the resist film in the cooling unit CP. Next, in the coating processing chamber 21, the resist film is formed on the substrate W by the coating processing unit 129 (FIG. 2). Thereafter, the thermal processing of the substrate W is performed in the thermal processing unit PHP, and the substrate W is placed on the substrate platform PASS5.

Further, the transport mechanism 127 transports the substrate W after the development processing that is placed on the substrate platform PASS6 (FIG. 4) to the substrate platform PASS2 (FIG. 4).

The transport mechanism 128 (FIG. 4) sequentially transports the substrate W placed on the substrate platform PASS3 to the adhesion reinforcement processing unit PAHP (FIG. 3), the cooling unit CP (FIG. 3) and the coating processing chamber 24. Then, the transport mechanism 128 sequentially transports the substrate W on which the anti-reflection film is formed by the coating processing chamber 24 to the thermal processing unit PHP (FIG. 3), the cooling unit CP (FIG. 3) and the coating processing chamber 23. Subsequently, the transport mechanism 128 sequentially transports the substrate W on which the resist film is formed by the coating processing chamber 23 to the thermal processing unit PHP (FIG. 3) and the substrate platform PASS7 (FIG. 4).

Further, the substrate mechanism 128 (FIG. 4) transports the substrate W after the development processing that is placed on the substrate platform PASS8 (FIG. 4) to the substrate platform PASS4 (FIG. 4). The processing contents for the substrate W in the coating processing chambers 23, 24 (FIG. 2) and the lower thermal processing section 302 (FIG. 3) are similar to the processing contents for the substrate W in the above-mentioned coating processing chambers 21, 22 (FIG. 2) and upper thermal processing section 301 (FIG. 3).

In the second processing block 13, the transport mechanism 137 (FIG. 4) sequentially transports the substrate W after the resist film formation that is placed on the substrate platform PASS5 to the edge exposure unit EEW (FIG. 3) and the placement buffer unit P-BF1 (FIG. 4). In this case, in the edge exposure unit EEW, the edge exposure processing is performed on the substrate W. The substrate W after the edge exposure processing is placed on the placement buffer unit P-BF1.

Further, the transport mechanism 137 (FIG. 4) takes out the substrate W after the exposure processing and the thermal processing from the thermal processing unit PHP (FIG. 3) that is adjacent to the cleaning drying processing block 14A. The transport mechanism 137 sequentially transports the substrate W to the cooling unit CP (FIG. 3), any one of the development processing chambers 31, 32 (FIG. 2), the thermal processing unit PHP (FIG. 3) and the substrate platform PASS6 (FIG. 4).

In this case, the substrate W is cooled to a temperature suitable for the development processing in the cooling unit CP, and then the development processing of the substrate W is performed by the development processing unit 139 in any one of the development processing chambers 31, 32. Thereafter, the thermal processing of the substrate W is performed in the thermal processing unit PHP, and the substrate W is placed on the substrate platform PASS6.

The transport mechanism 138 (FIG. 4) sequentially transports the substrate W after the resist film formation that is placed on the substrate platform PASS7 to the edge exposure unit EEW (FIG. 3) and the placement buffer unit P-BF2 (FIG. 4).

Further, the transport mechanism 138 (FIG. 4) takes out the substrate W after the exposure processing and the thermal processing from the thermal processing unit PHP (FIG. 3) that is adjacent to the interface block 14. The transport mechanism 138 sequentially transports the substrate W to the cooling unit CP (FIG. 3), any one of the development processing chambers 33, 34 (FIG. 2), the thermal processing unit PHP (FIG. 3) and the substrate platform PASS8 (FIG. 4). The processing contents for the substrate W in the development processing chambers 33, 34 and the lower thermal processing section 304 are similar to the processing contents for the substrate W in the above-mentioned development processing chambers 31, 32 and upper thermal processing section 303.

In the cleaning drying processing block 14A, the transport mechanism 141 (FIG. 1) transports the substrate W that is placed on each of the placement buffer units P-BF1, P-BF2 (FIG. 4) to the cleaning drying processing unit SD1 (FIG. 2) in the cleaning drying processing section 161. Then, the transport mechanism 141 transports the substrate W from the cleaning drying processing unit SD1 to the placement cooling platform P-CP (FIG. 4). In this case, the cleaning and drying processing of the substrate W is performed in the cleaning drying processing unit SD1, and then the substrate W is cooled in the placement cooling platform P-CP to a temperature suitable for the exposure processing in the exposure device 15 (FIG. 1).

The transport mechanism 142 (FIG. 1) transports the substrate W after the exposure processing that is placed on the substrate platform PASS9 (FIG. 4) to the cleaning drying processing unit SD2 (FIG. 3) in the cleaning drying processing section 162. Further, the transport mechanism 142 transports the substrate W after the cleaning and drying processing to the thermal processing unit PHP (FIG. 3) in the upper thermal processing section 303 or the thermal processing unit PHP (FIG. 3) in the lower thermal processing section 304 from the cleaning drying processing unit SD2. In this thermal processing unit PHP, post-exposure bake (PEB) processing is performed.

In the interface block 14, the transport mechanism 146 (FIG. 1) transports the substrate W before the exposure processing that is placed on the placement cooling platform P-CP (FIG. 4) to the substrate inlet 15a (FIG. 1) of the exposure device 15. Further, the transport mechanism 146 (FIG. 1) takes out the substrate W after the exposure processing from the substrate outlet 15b (FIG. 1) of the exposure device 15, and transports the substrate W to the substrate platform PASS9 (FIG. 4).

In the case where the exposure device 15 cannot receive the substrate W, the substrate W before the exposure processing is temporarily stored in each of the placement buffer units P-BF1, P-BF2. Further, in the case where the development processing unit 139 (FIG. 2) in the second processing block 13 cannot receive the substrate W after the exposure processing, the substrate W after the exposure processing is temporarily stored in each of the placement buffer units P-BF1, P-BF2.

In the present embodiment, processing of the substrate W in the coating processing chambers 21, 22, the development processing chambers 31, 32 and the upper thermal processing sections 301, 303 that are provided above, and the processing of the substrate W in the coating processing chambers 23, 24, the development processing chambers 33, 34 and the lower thermal processing sections 302, 304 that are provided below can be concurrently performed. Thus, it is possible to improve throughput without increasing a footprint.

(6) Configuration of Transport Mechanisms

Figure 5:
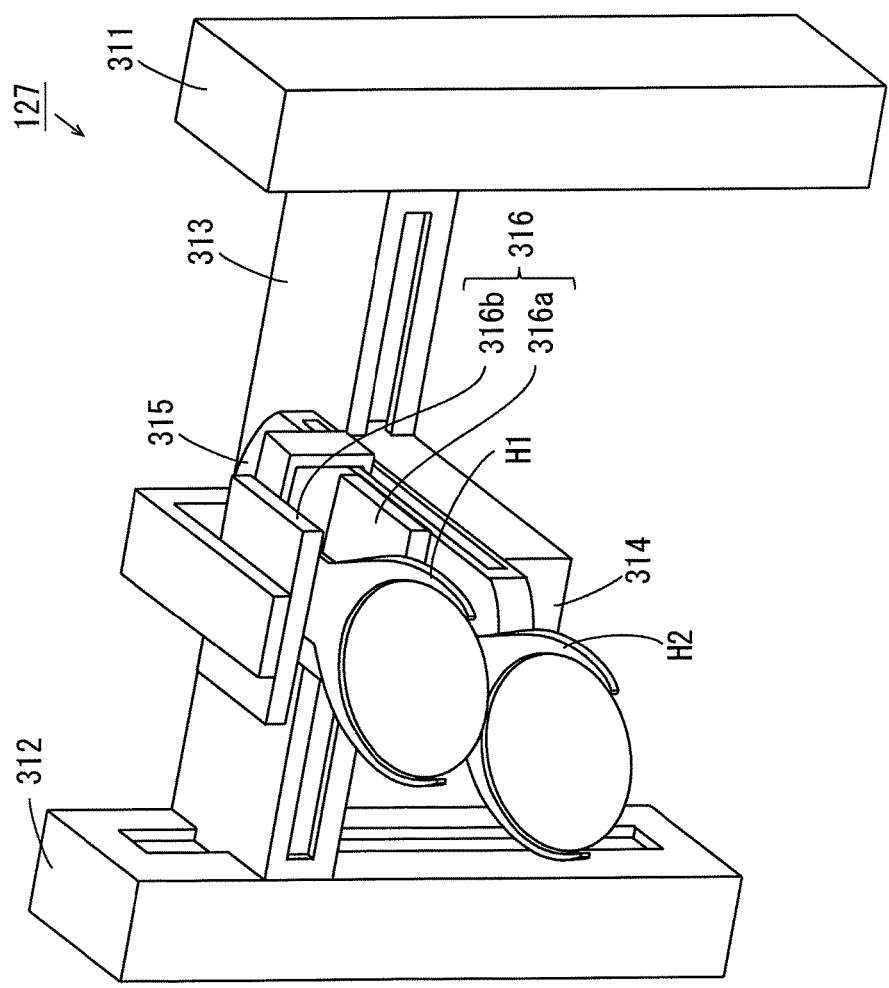
FIG. 5 is a perspective view showing a transport mechanism.

Next, the transport mechanism 127 will be described. FIG. 5 is a perspective view showing the transport mechanism 127. Each of the transport mechanisms 128, 137, 138 has the configuration similar to that of the transport mechanism 127. As shown in FIGS. 4 and 5, the transport mechanism 127 includes elongated guide rails 311, 312. As shown in FIG. 4, the guide rail 311 is fixed to the side of the transport section 112 to extend in the vertical direction in the upper transport chamber 125. The guide rail 312 is fixed to the side of the upper transport chamber 135 to extend in the vertical direction in the upper transport chamber 125.

As shown in FIGS. 4 and 5, an elongated guide rail 313 is provided between the guide rail 311 and the guide rail 312. The guide rail 313 is attached to the guide rails 311, 312 to be movable in the vertical direction. A moving member 314 is attached to the guide rail 313. The moving member 314 is provided to be movable in a longitudinal direction of the guide rail 313.

An elongated rotating member 315 is rotatably provided on an upper surface of the moving member 314. A hand H1 and a hand H2 for holding the substrates W are attached to the rotating member 315. In the present example, the hand H1 is positioned above the hand H2. The hands H1, H2 are provided to be movable in a longitudinal direction of the rotating member 315.

The above-mentioned configuration enables the transport mechanism 127 to move in the X and Z directions in the upper transport chamber 125. Further, the transport mechanism 127 can receive the substrate W from and transfer the substrate W to each of the coating processing chambers 21, 22 (FIG. 2), the substrate platforms PASS1, PASS2, PASS5, PASS6 (FIG. 4) or the upper thermal processing section 301 (FIG. 3) using each of the hands H1, H2.

Further, a sensor device 316 is attached to the rotating member 315. The sensor device 316 includes a light emitter holding casing 316a and a light receiver holding casing 316b. The light emitter holding casing 316a is arranged on an upper surface of the rotating member 315, and the light receiver holding casing 316b is arranged above the light emitter holding casing 316a.

Figure 6A:
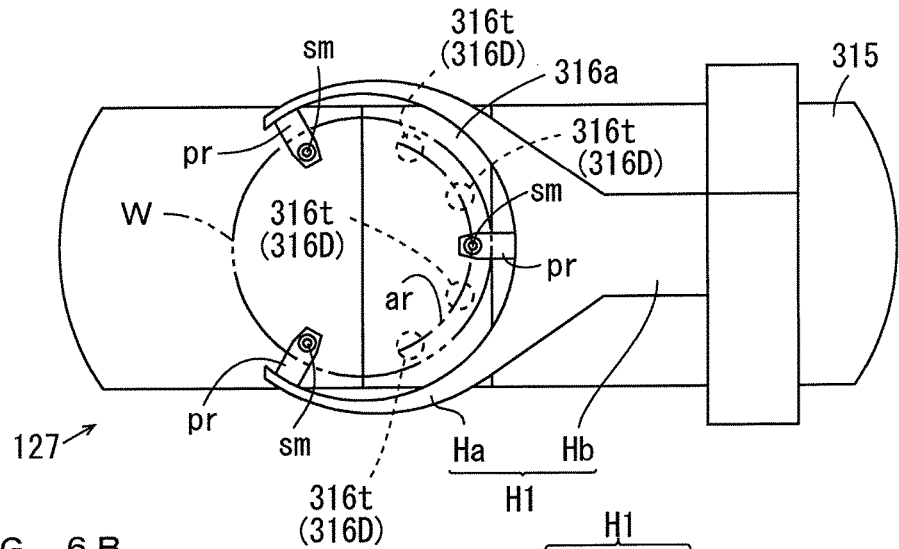
FIGS. 6A to 6C are a plan view, a side view and an end view showing the transport mechanism.
Figure 6B:
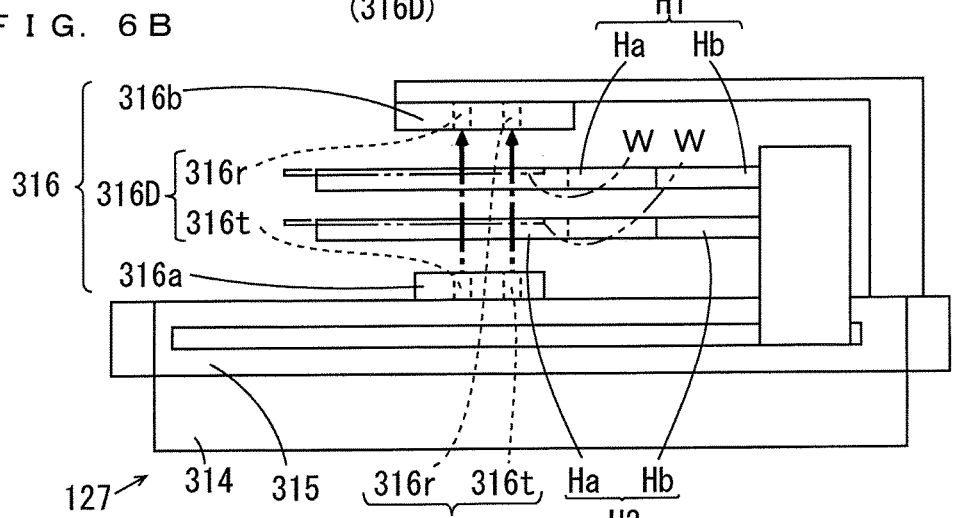
Figure 6C:
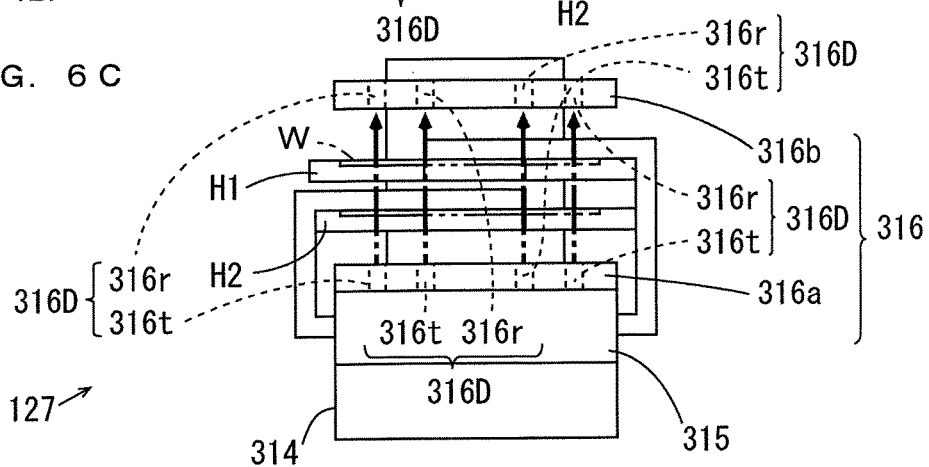

FIGS. 6A, 6B, 6C are a plan view, a side view and an end view showing the transport mechanism 127, respectively. As shown in FIG. 6A, the hand H1 is constituted by a guide portion Ha and an arm portion Hb. The guide portion Ha is substantially C-shaped, and the arm portion Hb is oblong. At an inner periphery of the guide portion Ha, a plurality (three in the present example) of projections pr are formed to be directed inward of the guide portion Ha at equal angular intervals about a center of a circle formed along the inner periphery of the guide portion Ha. A suction portion sm is provided at a tip end of each projection pr. Each suction portion sm is connected to an intake system (not shown).

In the hand H1, the substrate W is placed on the three suction portions sm of the three projections pr. In FIGS. 6A to 6C, the substrate W held by the hand H1 is indicated by two-dots and dash lines. In this state, the intake system connected to the three suction portions sm is controlled, and portions at three locations of the substrate W positioned on the three suction portions sm are sucked by the three suction portions sm, respectively. The hand H1 may have the four suction portions sm. In this case, portions at four locations of the substrate W positioned on the four suction portions sm are sucked by the four suction portions sm, respectively.

A suction signal indicating whether the plurality of suction portions sm are sucking the substrate W is supplied to the controller 500 of FIG. 4 from the hand H1. In the case where the plurality of suction portions sm are sucking the substrate W, the suction signal enters an ON state, and in the case where any one of the suction portions sm is not sucking the substrate W, the suction signal enters an OFF state.

The hand H2 has the configuration similar to that of the hand H1. In each of the hands H1, H2, a position at which the center of the held substrate W is to be positioned normally (hereinafter referred to as a normal position) is determined in advance. The normal position in the hand H1 is a center position of the circle formed along the inner periphery of the guide portion Ha, for example. The normal position in the hand H1 may be a center position among the plurality of suction portions sm.

Hereinafter, a limit position to which each of the hands H1, H2 can retreat in an advancing retreating direction of each of the hands H1, H2 is referred to as an advancing retreating reference position. In the examples of FIGS. 6A to 6C, the hands H1, H2 are respectively located at the advancing retreating reference positions.

The light emitter holding casing 316a is provided at substantially the center portion on the upper surface of the rotating member 315. In the light emitter holding casing 316a, a plurality (four in the present example) of light emitters 316*t* are held. The light receiver holding casing 316*b* is provided at a position above the rotating member 315 to be opposite to the light emitter holding casing 316*a*. In the light receiver holding casing 316*b*, a plurality (four in the present example) of light receivers 316*r* are held to be respectively opposite to the plurality of light emitters 316*t* held by the light emitter holding casing 316*a*. A detector 316D is constituted by the light emitter 316*t* and the light receiver 316*r* that are opposite to each other. As shown in FIG. 6C, in the present example, the sensor device 316 includes the four detectors 316D.

The four detectors 316D are arranged in an inner region of the guide portion Ha of the hand H1 located at the advancing retreating reference position in a horizontal plane. In the present example, the four detectors 316D are arranged at constant intervals on a circular arc ar concentric with the inner periphery of the guide portion Ha.

Light is emitted upward from the respective four light emitters 316*t*. The four light receivers 316*r* output light reception signals when respectively receiving the light emitted from the opposite four light emitters 316*t* as returning light. The light reception signal output from each light receiver 316*r* is supplied to the controller 500.

The four light emitters 316*t* are preferably arranged at positions further forward in the advancing retreating direction of the hand H1 than at least one suction portion sm of the plurality of suction portions sm of the hand H1 located at the advancing retreating reference position. In this case, the four portions at an outer periphery of the substrate W held by the hand H1 are respectively reliably detected by the four light emitters 316*t* during the transportation of the substrate W by the transport mechanism 127.

FIG. 7 is a block diagram showing a configuration of a control system of the transport mechanism 127. The configuration of the control system of each of the other transport mechanisms 128, 137, 138 is similar to the configuration of the control system of the transport mechanism 127 of FIG. 7.

As shown in FIG. 7, the controller 500 includes a CPU (Central Processing Unit) 510 and a memory 520. In the memory 520, tentative target position coordinates, described below, are stored, and correction information, described below, is stored. The CPU 510 performs various calculation based on the light reception signals supplied from the sensor device 316 of the transport mechanism 127, and stores the results in the memory 520. Further, the operation of the transport mechanism 127 is controlled based on the information stored in the memory 520.

(7) Teaching Operation Relating to Transport Mechanisms

The teaching operation relating to each of the transport mechanisms in the case where each of the hands H1, H2 of each of the transport mechanisms 127, 128, 137, 138 is moved towards a substrate supporter will be described. During installation of the substrate processing apparatus 100, the following teaching operation is performed. The substrate supporter is provided in each of the cooling units CP, the thermal processing units PHP and the adhesion reinforcement processing units PAHP, for example. Further, the substrate supporter is provided in each of the coating processing units 129, the development processing units 139 and the edge exposure units EEW, for example.

As the teaching operation, there are a teaching operation in the vertical direction and a teaching operation in the horizontal direction. In the following description, the teaching operation of the transport mechanism 127 will be explained. The teaching operation of each of the other transport mechanisms 128, 137, 138 is similar to the teaching operation of the transport mechanism 127.

The height of the substrate W supported by the substrate supporter is referred to as a reference height. The height of the hand H1 in the case where the hand H1 of the transport mechanism 127 is moved to a position below the substrate supporter WS in order to transfer the substrate W to the substrate supporter or receive the substrate W from the substrate supporter is referred to as a target height. The target height is determined by the teaching operation in the vertical direction.

Further, a position at which the substrate W is to be supported by the substrate supporter is referred to as a reference position. A position of the substrate W transferred to the substrate supporter by the hand H1 of the transport mechanism 127 before the teaching operation in the horizontal direction is referred to as a tentative target position. The correction information indicating a deviation between the reference position and the tentative target position is acquired by the teaching operation in the horizontal direction. The tentative target position is corrected to coincide with the reference position based on the correction information. The corrected tentative target position is referred to as a true target position.

In the case where the substrate supporter is the cooling unit CP, the thermal processing unit PHP or the adhesion reinforcement processing unit PAHP, the substrate W is automatically guided by a guide mechanism of the substrate supporter such that its center coincides with the reference position. On the other hand, in the case where the substrate supporter is each of the spin chucks 25, 35, 98, the center of the substrate W does not necessarily coincide with the reference position.

In the following description, positions in the X, Y, Z directions are indicated by X, Y, Z coordinates, respectively.

FIGS. 8A to 8D are diagrams for explaining the teaching operation in the vertical direction. Each of FIGS. 8A to 8D shows a longitudinal cross sectional view of the substrate supporter WS and the hand H1 of the transport mechanism 127 taken along the respective substantially center lines. In the examples of FIGS. 8A to 8D, the target height in the case where the hand H1 of the transport mechanism 127 is moved to a position below the substrate supporter WS is determined.

First, as shown in FIG. 8A, the substrate W is supported at the reference height by the substrate supporter WS. Next, as shown in FIG. 8B, the controller 500 moves the hand H1 from the advancing retreating reference position to a position below the substrate supporter WS in the horizontal direction. At this time point, the substrate W is not sucked by the plurality of suction portions sm of the hand H1. Therefore, the suction signal is in the OFF state. The transport mechanism 127 has an encoder. The controller 500 detects the position of the hand H1 based on the output signal of the encoder of the transport mechanism 127 at all times.

Subsequently, the controller 500 moves the hand H1 upward. In this case, as shown in FIG. 8C, the plurality of suction portions sm suck the substrate W at a time point at which the hand H1 is moved upward by a predetermined distance. Thus, the suction signal enters the ON state. The controller 500 determines the Z coordinate of the hand H1 at a time point at which the suction signal enters the ON state as a Z coordinate of the reference height. Further, the controller 500 determines a coordinate, which is acquired in the case where a predetermined offset amount in the vertical direction is added to the Z coordinate of the reference height, as a Z coordinate of the target height.

The Z coordinate of the reference height is referred to as a reference height coordinate, and the Z coordinate of the target height is referred to as a target height coordinate. The target height coordinate, and the offset amount between the target height coordinate and the reference height coordinate are stored in the memory 520 of the controller 500. Thereafter, as shown in FIG. 8D, the controller 500 moves the hand H1 to a position above the substrate supporter WS and then moves the hand H1 to the advancing retreating reference position in the horizontal direction.

Figure 9A:
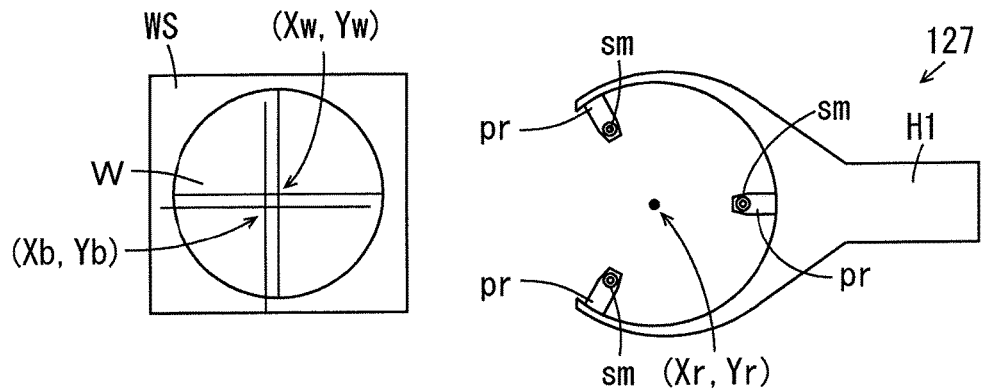
FIGS. 9A to 9C are diagrams for explaining a teaching operation in a horizontal direction.
Figure 9B:
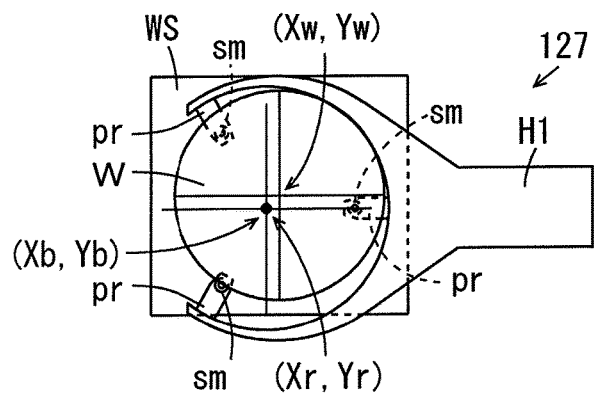
Figure 9C:
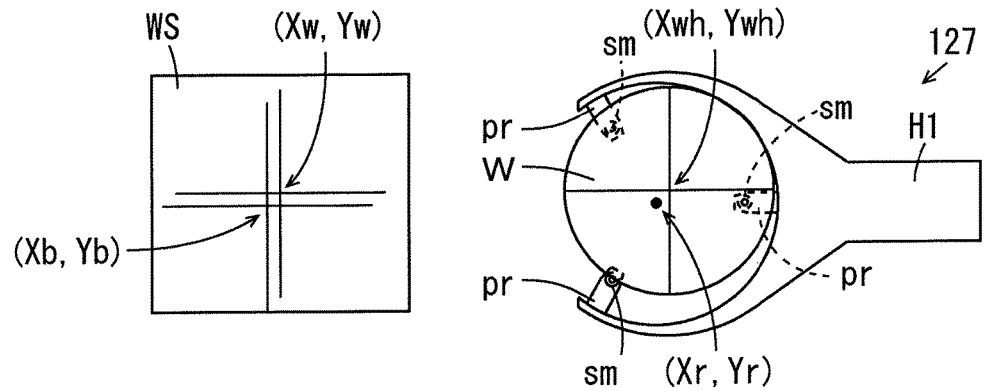

FIGS. 9A to 9C are diagrams for explaining the teaching operation in the horizontal direction. FIGS. 9A to 9C show plan views of the substrate supporter WS and the hand H1 of the transport mechanism 127. In the examples of FIGS. 9A to 9C, the correction information about the substrate supporter WS is acquired with the use of the hand H1 of the transport mechanism 127.

First, as shown in FIG. 9A, the substrate W is supported on the substrate supporter WS. The substrate W is supported with its center accurately coinciding with the reference position. On the other hand, before the teaching operation in the horizontal direction, the controller 500 does not recognize the reference position in the substrate supporter WS. Therefore, the tentative target position does not necessarily coincide with the reference position.

Hereinafter, the coordinates of the reference position are referred to as reference position coordinates, and the coordinates of the tentative target position are referred to as tentative target position coordinates. Further, the coordinates of the normal position in the hand H1 are referred to as normal position coordinates. The reference position coordinates are (Xw, Yw), the tentative target position coordinates are (Xb, Yb) and the normal position coordinates are (Xr, Yr). The tentative target position coordinates are stored in the memory 520 of the controller 500. In the example of FIG. 9A, the reference position coordinates (Xw, Yw) do not coincide with the tentative target position coordinates (Xb, Yb).

In the state of FIG. 9A, the controller 500 lifts the substrate W to a position above the substrate supporter WS by lifting a plurality of lift pins (not shown) from positions below the substrate supporter WS towards positons above the substrate supporter WS. Next, the hand H1 is moved in the horizontal direction from the advancing retreating reference position such that the normal position in the hand H1 coincides with the tentative target position. At this time point, the hand H1 is positioned above the substrate supporter WS and below the substrate W.

Subsequently, the controller 500 lowers the substrate W by lowering the plurality of lift pins (not shown). Thus, as shown in FIG. 9B, the substrate W is sucked by the plurality of suction portions sm of the hand H1. In this case, the substrate W is held by the hand H1 with its center deviating from the normal position.

Thereafter, as shown in FIG. 9C, the controller 500 moves the hand H1 in the horizontal direction to the advancing retreating reference position. The hand H1 retreats from a position further forward than the sensor device 316 to the advancing retreating reference position on the rotating member 315 of FIGS. 5 to 6C, whereby a plurality of portions at the outer periphery of the substrate W held by the hand H1 are respectively detected. Details relating to a method of detecting the outer periphery of the substrate W held by the hand H1 will be described below.

The controller 500 detects the position of the center of the substrate W in the hand H1 (hereinafter referred to as a detection position) based on a result of detection of the plurality of portions at the outer periphery of the substrate W. Hereinafter, the coordinates of the detection position are referred to as detection position coordinates. The detection position coordinates are (Xwh, Ywh). Next, deviations of the reference position coordinates ($\Delta X$, $\Delta Y$) from the tentative target position coordinates in the X and Y directions are calculated as the correction information based on the following formulas (1), (2).

$$\Delta X = Xr - Xwh \tag{1}$$

$$\Delta Y = Yr - Ywh \tag{2}$$

Subsequently, the controller 500 calculates the coordinates of the true target position (hereinafter referred to as true target position coordinates) based on the following formulas (3), (4). The true target position coordinates are (Xrb, Yrb). The true target position coordinates (Xrb, Yrb) are stored in the memory 520 of the controller 500.

$$Xrb = Xb - \Delta X \tag{3}$$

$$Yrb = Yb - \Delta Y \tag{4}$$

Thus, the true target position coordinates (Xrb, Yrb) coincide with the reference position coordinates (Xw, Yw).

During the processing of the substrate W, the controller 500 controls the transport mechanism 127 such that the hand H1 moves to the true target position. As a result, the substrate W is transferred to the substrate supporter WS by the hand H1 such that the center of the substrate W coincides with the reference position in the substrate supporter WS. Further, the substrate W is received from the substrate supporter WS by the hand H1 to be held at the normal position in the hand H1.

While the teaching operation with the hand H1 of the transport mechanism 127 is described in the above-mentioned example, the teaching operation with the hand H2 is similar to the teaching operation with the hand H1. Further, each of the transport mechanisms 128, 137, 138 has the configuration and operations similar to the configuration and operations of the transport mechanism 127. Therefore, the teaching operation with each of the transport mechanisms 128, 137, 138 is similar to the teaching operation with the transport mechanism 127.

(8) Method of Detecting Outer Periphery of Substrate

FIGS. 10A to 10H are diagrams for explaining the method of detecting the plurality of portions at the outer periphery of the substrate W by the sensor device 316 of FIGS. 5 to 6C. In each of FIGS. 10A, 10C, 10E, 10G, changes in condition of the hand H1, the rotating member 315 and the plurality of detectors 316D in the case where the hand H1 retreats towards the advancing retreating reference position are shown in plan views. Schematic cross sectional views taken along the lines Q-Q of FIGS. 10A, 10C, 10E, 10G are respectively shown in FIGS. 10B, 10D, 10F, 10H. Explanation concerning the hand H2 is omitted.

First, at a time point at which the substrate W is received by the hand H1, the hand H1 is positioned at a position further forward than the four detectors 316D. In this case, the hand H1 is not positioned between the four light emitters 316t and the four light receivers 316r. Therefore, the four light receivers 316r receive the light from the respectively opposite four light emitters 316t. Thus, the light reception signals are supplied to the controller 500.

Figure 10A:
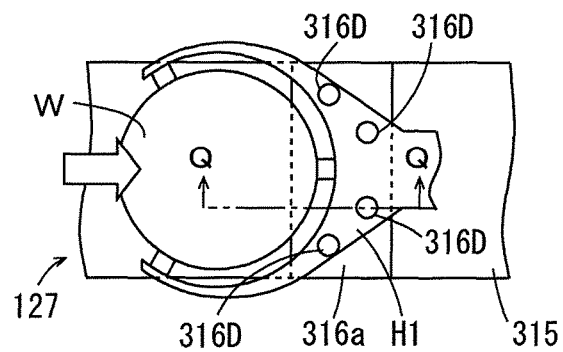
FIGS. 10A to 10H are diagrams for explaining a method of detecting a plurality of portions at an outer periphery of a substrate by a sensor device of FIGS. 5 to 6C.
Figure 10B:
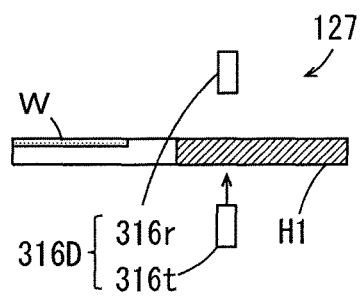

Next, the hand H1 retreats. In this case, as shown in FIGS. 10A and 10B, the hand H1 enters the space between the four light emitters 316*t* and the four light receivers 316*r*. At this time, the light emitted from the four light emitters 316*t* is shielded by the hand H1, so that the four light receivers 316*r* do not receive the light from the respectively opposite four light emitters 316*t*. Therefore, the light reception signals are not supplied to the controller 500.

Figure 10C:
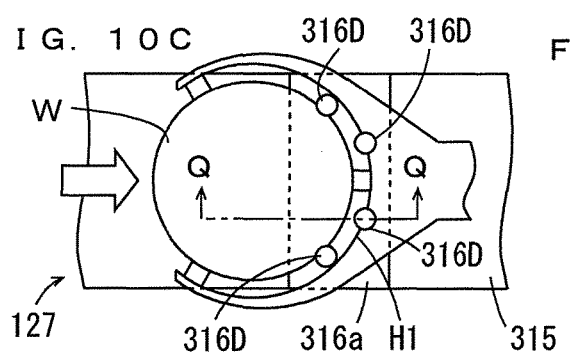
Figure 10D:
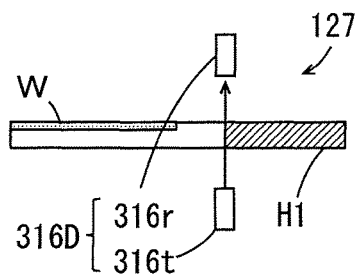

Next, as shown in FIGS. 10C and 10D, the hand H1 passes through the space between the four light emitters 316*t* and the four light receivers 316*r*. At a time point at which the hand H1 passes through a space between each light emitter 316*t* and the light receiver 316*r* opposite to the light emitter 316*t*, each light receiver 316*r* receives the light from the opposite light emitter 316*t*. Thus, the light reception signal is supplied to the controller 500.

Figure 10E:
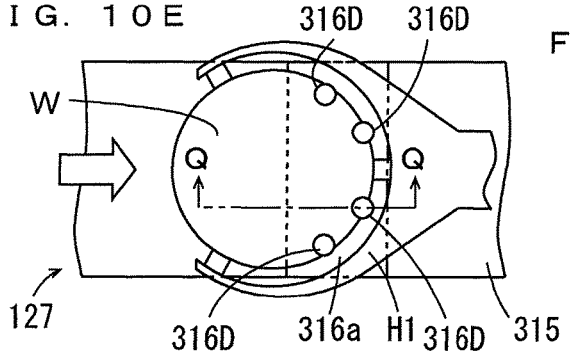
Figure 10F:
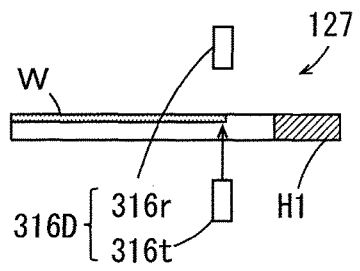

Next, as shown in FIGS. 10E and 10F, the substrate W held by the hand H1 enters the space between the four light emitters 316*t* and the four light receivers 316*r*. At a time point at which the outer periphery of the substrate W held by the hand H1 enters the space between each light emitter 316*t* and the light receiver 316*r* opposite to the light emitter 316*t*, the light emitted from each light emitter 316*t* is shielded by the outer periphery of the substrate W. In this case, each light receiver 316*r* does not receive the light from the opposite light emitter 316*t*. Therefore, the light reception signal is not supplied to the controller 500.

Figure 10G:
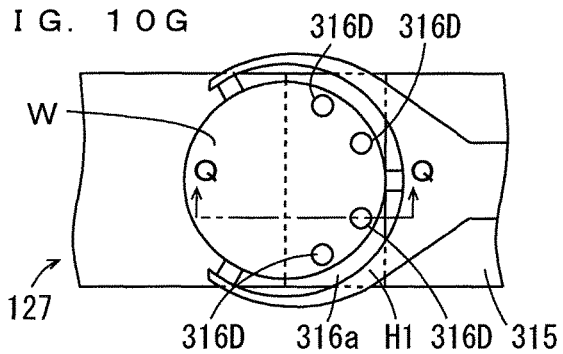
Figure 10H:
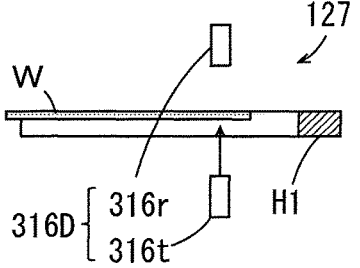

Next, as shown in FIGS. 10G and 10H, the hand H1 is stopped at the advancing retreating reference position. At this time, the substrate W held by the hand H1 is positioned in the space between the four light emitters 316*t* and the four light receivers 316*r*. In this case, the four light receivers 316*r* do not receive the light from the respectively opposite four light emitters 316*t*. Therefore, the light reception signal is not supplied to the controller 500.

As described above, the light reception signals are respectively intermittently supplied from the four light receivers 316*r* of the four detectors 316D to the controller 500 from the time when the substrate W is received by the hand H1 until the time when the hand H1 is moved to the advancing retreating reference position.

The controller 500 detects the four portions at the outer periphery of the substrate W based on a time point at which the light reception signal from each of the four light receivers 316*r* is no longer supplied due to the outer periphery of the substrate W (the time point described in FIGS. 10E and 10F). Normal data is stored in the memory 520 of the controller 500 in advance. The normal data is the data indicating the result of detection of the four portions at the outer periphery of the substrate W acquired in the case where the hand H1 is moved from a position further forward than the sensor device 316 to the advancing retreating reference position with the center of the substrate W coinciding with the normal position in the hand H1.

The sensor device 316 is fixed to the rotating member 315. Therefore, the positions of the plurality of detectors 316D of the sensor device 316 on the coordinates are not changed. Then, the controller 500 calculates the coordinates indicating the positions of the four portions at the outer periphery of the substrate W in the case where the hand H1 is at the advancing retreating reference position based on the differences between the result of detection of the four portions at the outer periphery of the substrate W and the result of detection of the four portions of the normal data. The coordinates of the position of the center of the substrate W in the case where the hand H1 is located at the advancing retreating reference position are calculated based on the calculated coordinates of the positions of the four portions.

The coordinates of the position of the center of the substrate W in the hand H1 can be calculated based on coordinates of three portions at the outer periphery of the substrate W. In the present example, the coordinates of the four portions at the outer periphery of the substrate W are acquired. Thus, even in the case where one portion of the four portions is a cutout portion (an orientation flat or a notch) for positioning the substrate W, for example, the coordinates of the position of the center of the substrate W can be calculated based on the coordinates of the three portions except for the coordinates of the cutout portion. In the case where an outer diameter of the substrate W is known, the coordinates of the position of the center of the substrate W can be calculated based on coordinates of two portions at the outer periphery of the substrate W. In this case, the sensor device 316 may be constituted by the two or three detectors 316D.

(9) Reference Position in Substrate Supporter

As described above, in the teaching operation, in the case where the substrate supporter WS is the cooling unit CP, the thermal processing unit PHP or the adhesion reinforcement processing unit PAHP, the substrate W is supported with its center accurately coinciding with the reference position in the substrate supporter WS. The reference position in the substrate supporter WS will be described below.

Figure 11:
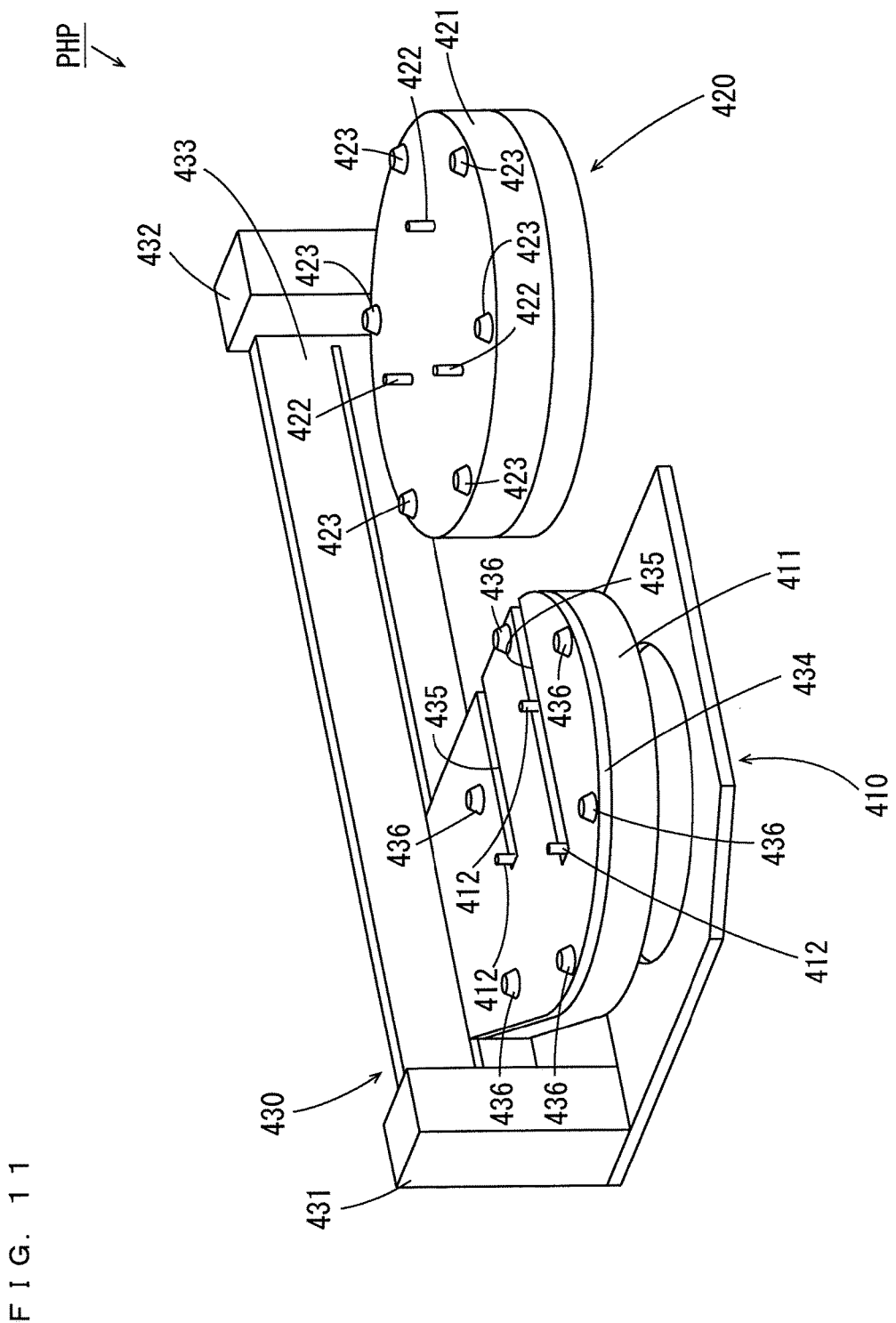
FIG. 11 is a perspective view of a thermal processing unit.
Figure 12:
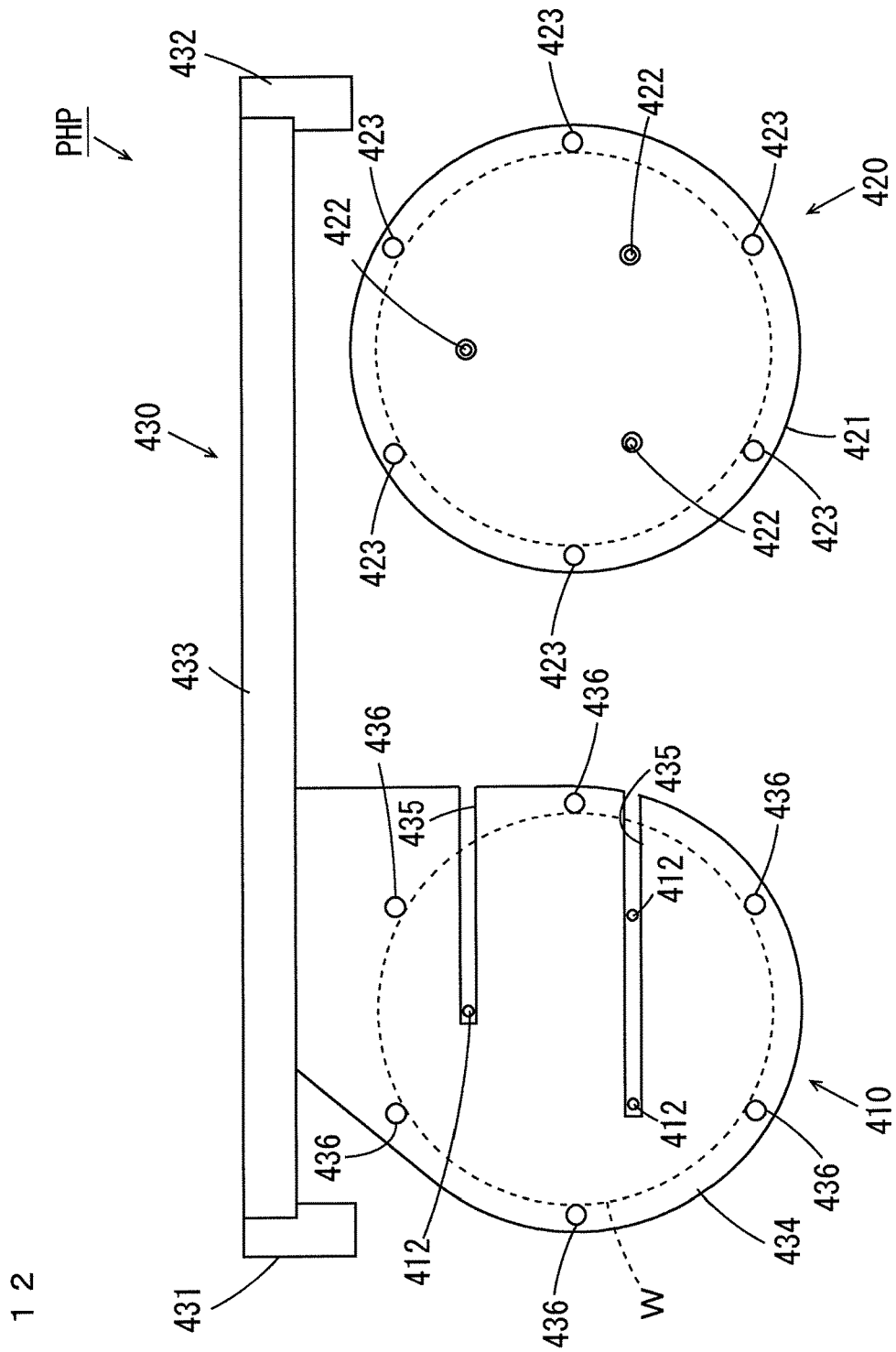
FIG. 12 is a plan view of the thermal processing unit of FIG. 11.
Figure 13:
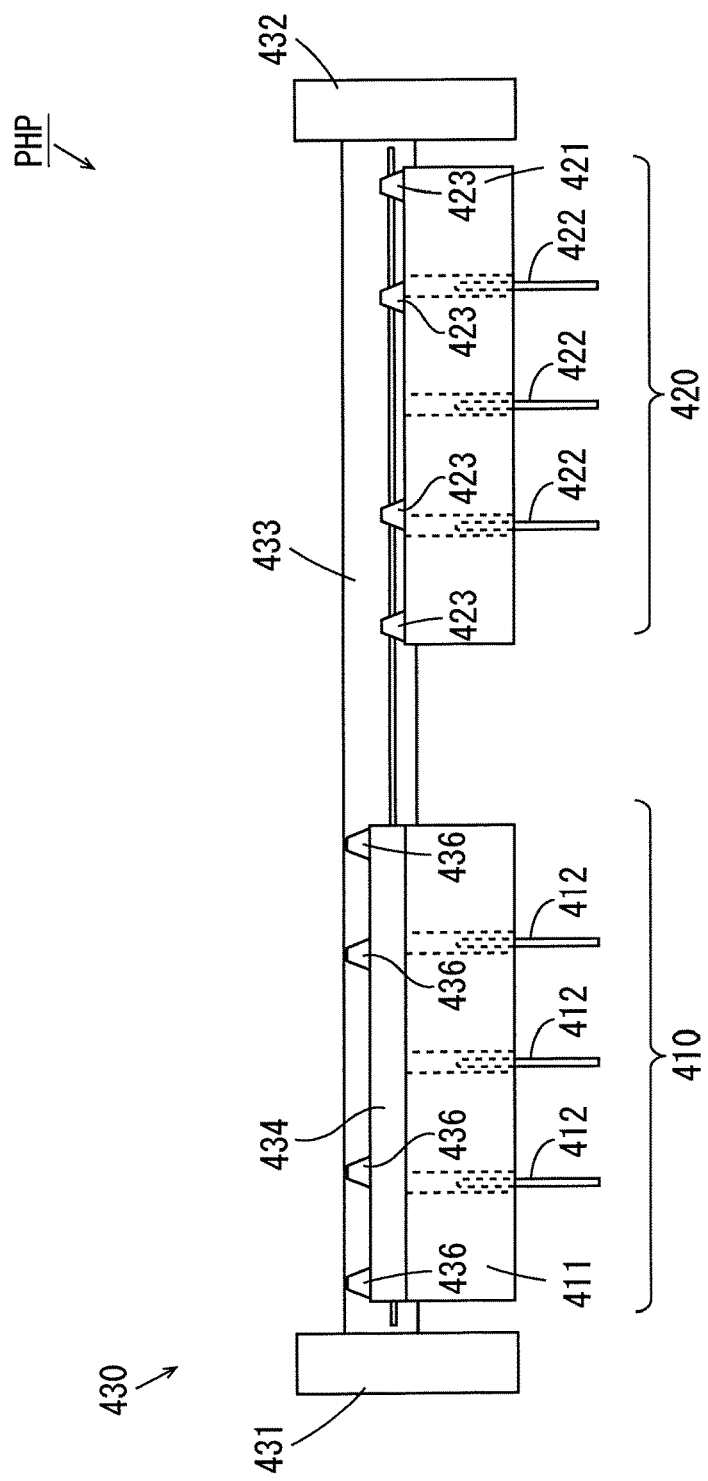
FIG. 13 is a side view of the thermal processing unit of FIG. 11.

FIG. 11 is a perspective view of the thermal processing unit PHP. FIG. 12 is a plan view of the thermal processing unit PHP of FIG. 11. FIG. 13 is a side view of the thermal processing unit PHP of FIG. 11. As shown in each of FIGS. 11 and 12, the thermal processing unit PHP includes a cooler 410, a heater 420 and a transport mechanism 430. The cooler 410 and the heater 420 are arranged in one direction. The transport mechanism 430 is arranged to be capable of transporting the substrate W between the cooler 410 and the heater 420.

The cooler 410 includes a substrate placement plate 411 and a plurality (three in the present example) of liftable and lowerable support pins 412. The substrate placement plate 411 is a cooling plate, for example. A plurality (three in the present example) of support pin insertion holes are formed in the substrate placement plate 411. A transport arm 434 of the below-mentioned transport mechanism 430 comes into contact with an upper surface of the substrate placement plate 411, whereby the substrate W held by the transport arm 434 can be cooled together with the transport arm 434.

The plurality of support pins 412 are arranged to be insertable into the plurality of support pin insertion holes in the substrate placement plate 411 by moving in the vertical direction. When the substrate W is carried into and carried out from the cooler 410, upper ends of the plurality of support pins 412 are moved between positions higher than the substrate placement plate 411 and positions lower than the upper surface of the substrate placement plate 411 through the plurality of support pin insertion holes respectively.

The heater 420 includes a substrate placement plate 421, a plurality (three in the present example) of liftable and lowerable support pins 422 and a plurality (six in the present example) of guide members 423. The substrate placement plate 421 is a hot plate for performing heating processing on the substrate W, for example. In the substrate placement plate 421, a plurality (three in the present example) of support pin insertion holes are formed. Each of the plurality of support pins 422 has the configuration similar to the configuration of each of the plurality of support pins 412.

The plurality of guide members 423 are provided along an edge of the substrate placement plate 421 at substantially equal intervals. In the present example, the six guide members 423 are provided at intervals of substantially 60°. As shown in FIG. 13, each guide member 423 has a truncated cone-shape. In the case where the substrate W is arranged in a region surrounded by the plurality of guide members 423, the substrate W is guided downward along the inclined side surfaces of the guide members 423. Thus, the center of the substrate placement plate 421 coincides with the center of the substrate W.

The transport mechanism 430 includes two elongated guide rails 431, 432 provided to extend in the vertical direction. The guide rails 431, 432 are arranged to be opposite to each other with the cooler 410 and the heater 420 sandwiched therebetween. An elongated guide rail 433 is provided between the guide rail 431 and the guide rail 432. The guide rail 433 is attached to the guide rails 431, 432 to be movable in the vertical direction. The transport arm 434 is attached to the guide rail 433. The transport arm 434 is provided to be movable in the longitudinal direction of the guide rail 433.

As shown in FIG. 12, slits 435 are provided in the transport arm 434 such that the transport arm 434 does not interfere with the plurality of support pins 412 of the cooler 410 and the plurality of support pins 422 of the heater 420. Further, a plurality of guide members 436 are provided at the transport arm 434. Each of the plurality of guide members 436 has the configuration similar to that of each of the plurality of guide members 423. During the substrate processing, the transport arm 434 transports the substrate W between the cooler 410 and the heater 420. In the present example, the transport arm 434 is the substrate supporter WS, and the plurality of guide members 436 are the guide mechanisms.

FIGS. 14A to 14E are diagrams for explaining the reference position in the case where the substrate supporter WS is provided in the thermal processing unit PHP. The reference position in the case where the transport arm 434 of the thermal processing unit PHP is the substrate supporter WS will be explained below. The reference position in each of the cooling unit CP and the adhesion reinforcement processing unit PAHP is similar to the reference position in the thermal processing unit PHP.

During the teaching operation, the plurality of support pins 412 of the cooler 410 are first lifted as shown in FIG. 14A. Next, as shown in FIG. 14B, the transport mechanism 127 holds the substrate W using the hand H1 and transports the substrate W to the upper ends of the plurality of lifted support pins 412. Thus, the substrate W is supported by the plurality of support pins 412 with its center positioned at the tentative target position.

Thereafter, as shown in FIG. 14C, the plurality of support pins 412 are lowered. In the case where the tentative target position does not coincide with the reference position, the substrate W is guided downward along the inclined side surfaces of the plurality of guide members 436 on the transport arm 434 as indicated by the arrow in FIG. 14C. Thus, the center of the transport arm 434 coincides with the center of the substrate W.

Next, as shown in FIG. 14D, the plurality of support pins 412 are lifted. Subsequently, as shown in FIG. 14E, the transport mechanism 127 receives the substrate W using the hand H1 from the plurality of support pins 412. In FIG. 14D, the position of the center of the substrate W supported by the plurality of support pins 412 is the reference position. That is, the position of the center of the substrate W guided by the plurality of guide members 436 is the reference position.

(10) Teaching Operation in Spin Chuck

When each of the spin chucks 25, 35, 98 is the substrate supporter WS, in the case where the position of the rotational center of each of the spin chucks 25, 35, 98 is known, the teaching operation in the horizontal direction may be performed with the position of the rotational center as the reference position. On the other hand, in the case where the position of the rotational center of each of the spin chucks 25, 35, 98 is unknown, the teaching operation in the horizontal direction may be performed according to the following steps.

FIGS. 15A to 15D are diagrams for explaining the teaching operation in the horizontal direction in the case where each of the spin chucks 25, 35, 98 is the substrate supporter WS. FIGS. 15A to 15D show schematic plan views of the transport mechanism 127 and the spin chuck 25. In the examples of FIGS. 15A to 15D, the substrate supporter WS is the spin chuck 25. The teaching operation in each of the spin chucks 35, 98 is similar to the teaching operation in the spin chuck 25.

Figure 15A:
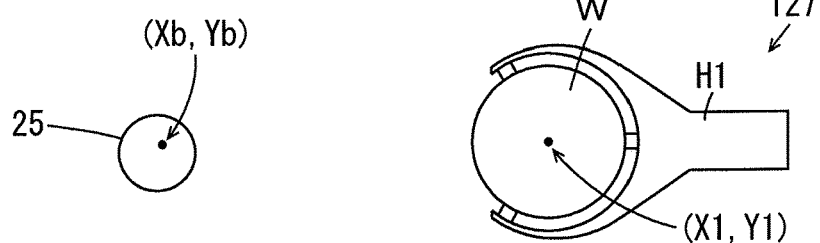
FIGS. 15A to 15D are diagrams for explaining the teaching operation in the horizontal direction in the case where a spin chuck is the substrate supporter.
Figure 15B:
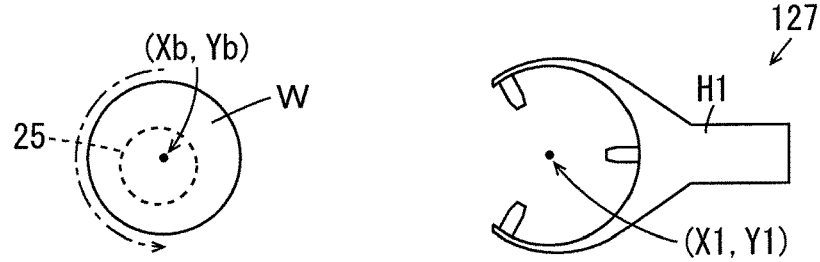
Figure 15C:
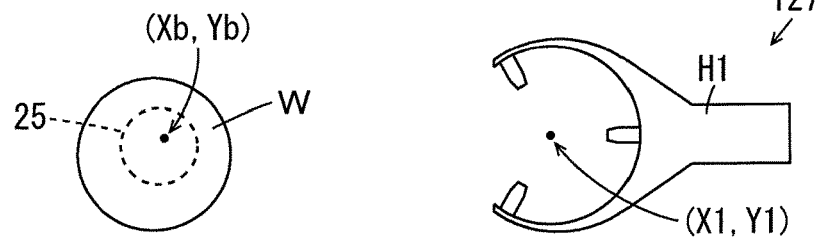

First, as shown in FIG. 15A, the transport mechanism 127 holds the substrate W at the normal position using the hand H1. The coordinates of the center of the substrate W are calculated. The calculated coordinates of the center of the substrate W are (X1, Y1). Next, as shown in FIG. 15B, the transport mechanism 127 transports the substrate W to the spin chuck 25. The spin chuck 25 holds the substrate W such that the center of the substrate W coincides with the tentative target position. Subsequently, as shown in FIG. 15C, the spin chuck 25 rotates the substrate W by a predetermined angle. The rotation angle of the substrate W by the spin chuck 25 is preferably 180°.

Figure 15D:
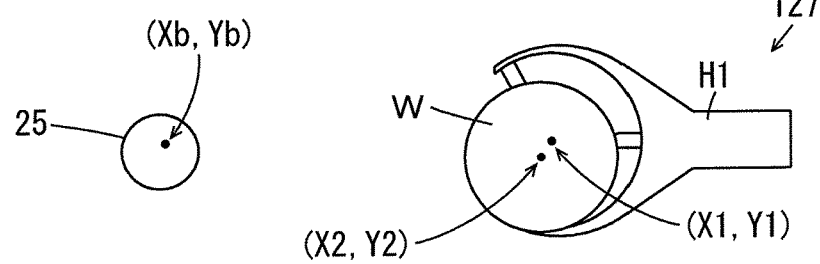

Thereafter, as shown in FIG. 15D, the transport mechanism 127 receives the substrate W from the spin chuck 25. The coordinates of the center of the substrate W are calculated. The calculated coordinates of the center of the substrate W are (X2, Y2). Next, deviations (ΔX, ΔY) of the reference position coordinates from the tentative target position coordinates are calculated based on the calculated coordinates (X1, Y1) and coordinates (X2, Y2). In the processing of FIGS. 15B and 15C, in the case where the rotation angle of the substrate W is 180°, the deviations (ΔX, ΔY) of the reference position coordinates from the tentative target position coordinates are supplied by the following formulas (5), (6).

$$\Delta X = (X1 + X2)/2 \tag{5}$$

$$\Delta Y = (Y1 + Y2)/2 \tag{6}$$

Next, the true target position coordinates (Xrb, Yrb) are calculated. The true target position Xrb in the X direction is supplied by the following formula (7). In the case of X1<X2, a positive sign is applied, and in the case of X1>X2, a negative sign is applied. Further, the true target position Yrb in the Y direction is supplied by the following formula (8). In the case of Y1<Y2, the positive sign is applied, and in the case of Y1>Y2, the negative sign is applied. The calculated true target position coordinates (Xrb, Yrb) are stored in the memory 520 of the controller 500 as the correction information.

$$Xrb = Xb \pm \Delta X \tag{7}$$

$$Yrb = Yb \pm \Delta Y \tag{8}$$

While the teaching operation with the hand H1 of the transport mechanism 127 is described in the above-mentioned example, the teaching operation with the hand H2 is similar to the operation with the hand H1. Further, the teaching operation with each of transport mechanisms 128, 137, 138 is similar to the teaching operation with the transport mechanism 127.

(11) Position Deviation Detection Operation (a) Position Deviation Detection Operation in Horizontal Direction After the teaching operation is performed and also the maintenance of the substrate processing apparatus 100 is performed, the position deviation detection operation of the substrate supporter WS is performed. The position deviation detection operation includes a position deviation detection operation in the horizontal direction and a position deviation detection operation in the vertical direction.

FIGS. 16A to 16D are diagrams for explaining the position deviation detection operation in the horizontal direction in the case where the substrate supporter WS is provided in the spin chuck. FIGS. 16A to 16D show schematic plan views of the transport mechanism 127 and the spin chuck 25. In the examples of FIGS. 16A to 16D, the substrate supporter WS is the spin chuck 25. The position deviation detection operation in each of the spin chucks 35, 98 is similar to the position deviation detection operation in the spin chuck 25.

During the substrate processing, the hand H1 is moved to the true target position based on the correction information stored in the memory 520. Thus, the substrate W is transferred to the substrate supporter WS by the hand H1 or the substrate W is received from the substrate supporter WS by the hand H1. Therefore, the substrate W can be transferred to the substrate supporter WS by the hand H1 to be supported at the reference position. Alternatively, the hand H1 can be moved towards the substrate supporter WS to receive the substrate W supported at the reference position.

Figure 16A:
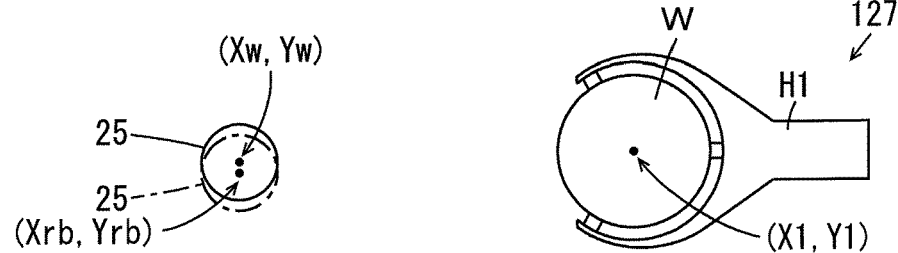
FIGS. 16A to 16D are diagrams for explaining a position deviation detection operation in the horizontal direction in the case where the substrate supporter is provided in the spin chuck.

After the maintenance of the substrate processing apparatus 100 is performed, the spin chuck 25 that is detached from the driving device (not shown) during the maintenance is attached to the driving device. As shown in FIG. 16A, the spin chuck 25 may be attached to the driving device with its reference position deviating. In FIG. 16A, the pre-detachment spin chuck 25 is indicated by a one-dot and dash line.

Figure 16B:
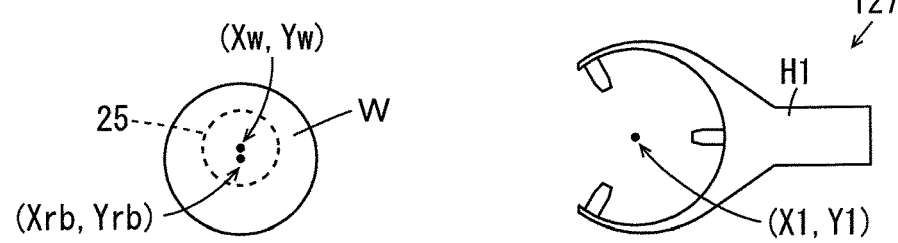

In this case, as shown in FIG. 16B, even in the case where the hand H1, holding the substrate W at the normal position, is moved to the true target position, the substrate W cannot be transferred to the spin chuck 25 to be supported at the reference position. Similarly, even in the case where the hand H1 is moved to the true target position, the substrate W supported at the reference position in the spin chuck 25 cannot be received at the normal position in the hand H1.

Figure 16C:
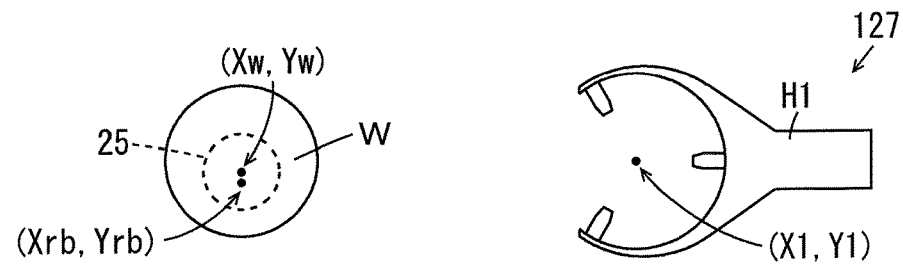
Figure 16D:
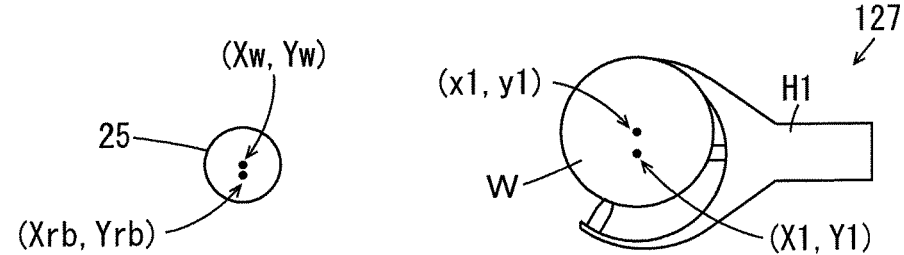

Then, as shown in FIG. 16C, during the position deviation detection operation, the spin chuck 25 rotates the substrate W by a predetermined angle while supporting the substrate W. The rotation angle of the substrate W by the spin chuck 25 is preferably 180°. Thereafter, as shown in FIG. 16D, the hand H1 moves the normal position to the true target position, and receives the substrate W from the spin chuck 25. Then, coordinates of the center of the substrate W are calculated. The calculated coordinates of the center of the substrate W are (x1, y1).

A distance from a midpoint between the coordinates (X1, Y1) of the normal position and the calculated coordinates (x1, y1) to the coordinates (X1, Y1) of the normal position is equal to a distance between the reference position coordinates (Xw, Yw) and the true target position coordinates (Xrb, Yrb). In the case where a deviation amount between the coordinates (X1, Y1) of the normal position and the calculated coordinates (x1, y1) is larger than a predetermined threshold value, an alarm is output. Thus, an operator is notified of an occurrence of a position deviation of the spin chuck 25.

For example, an alarm may be output by voice, generation of alarm sound such as a buzzer or an alarm display by a lamp and the like. Alternatively, an alarm may be output by display of characters or a figure on a screen.

FIGS. 17A to 17D are diagrams for explaining the position deviation detection operation in the horizontal direction in the case where the substrate supporter WS is provided in the thermal processing unit PHP. FIGS. 17A to 17D partially show schematic plan views of the transport mechanism 127 and the thermal processing unit PHP. The position deviation detection operation in each of the cooling unit CP and the adhesion reinforcement processing unit PAHP is similar to the position deviation detection operation in the thermal processing unit PHP.

Figure 17A:
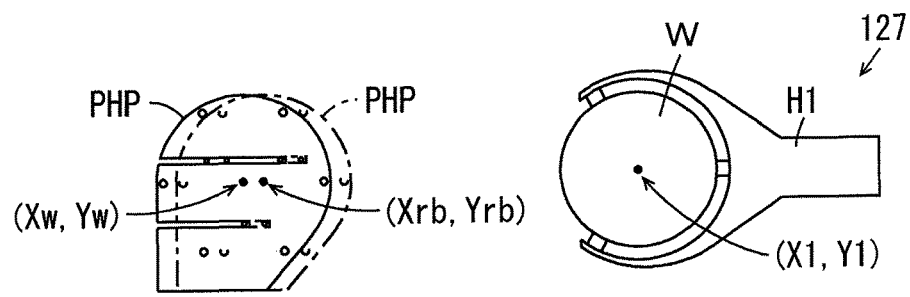
FIGS. 17A to 17D are diagrams for explaining the position deviation detection operation in the horizontal direction in the case where the substrate supporter is provided in the thermal processing unit.

After the maintenance of the substrate processing apparatus 100 is performed, each of the thermal processing sections 123, 133 (see FIG. 3) is moved from the maintenance position to the regular position. Each of the thermal processing sections 123, 133 may be moved to a position deviating from the regular position. In FIG. 17A, the thermal processing unit PHP in the case where the thermal processing section is at the regular position is indicated by a one-dot and dash line.

Figure 17B:
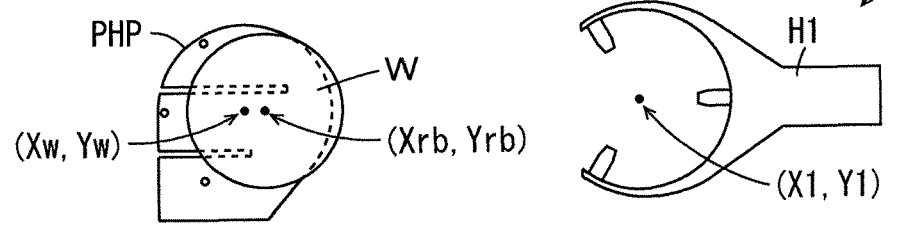

In this case, as shown in FIG. 17B, even in the case where the hand H1, holding the substrate W at the normal position, is moved to the true target position, the substrate W cannot be transferred to the thermal processing unit PHP to be supported at the reference position. Similarly, even in the case where the hand H1 is moved to the true target position, the substrate W supported at the reference position in the thermal processing unit PHP cannot be received at the normal position in the hand H1.

Figure 17C:
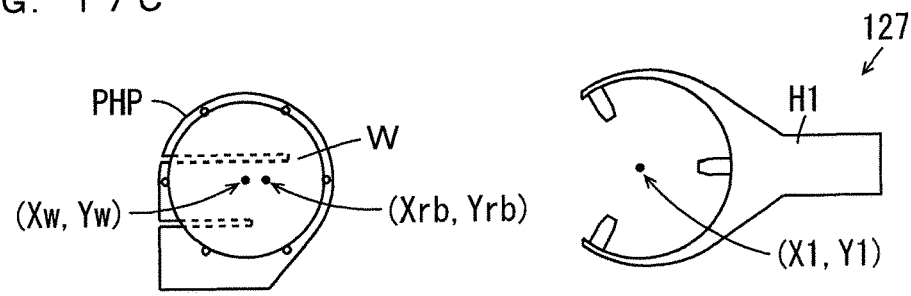
Figure 17D:
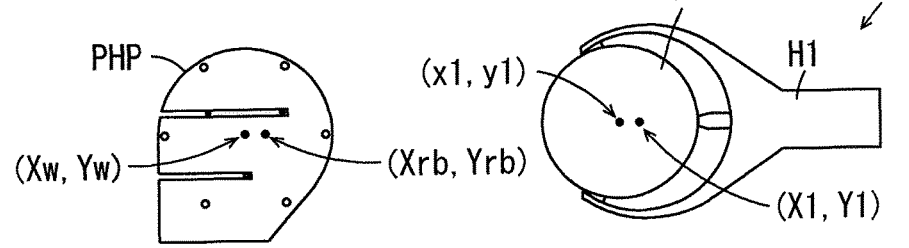

Then, as shown in FIG. 17C, during the positon deviation detection operation, the substrate W supported at the reference position in the thermal processing unit PHP is prepared. Thereafter, as shown in FIG. 17D, the hand H1 moves the normal position to the true target position, and receives the substrate W from the thermal processing unit PHP. Then, the coordinates of the center of the substrate W are calculated. The calculated coordinates of the center of the substrate W are (x1, y1).

A distance between the coordinates (X1, Y1) of the normal position and the calculated coordinates (x1, y1) is equal to a distance between the reference position coordinates (Xw, Yw) and the true target position coordinates (Xrb, Yrb). In the case where a deviation amount between the coordinates (X1, Y1) of the normal position and the calculated coordinates (x1, y1) is larger than a predetermined threshold value, an alarm is output. Thus, the operator is notified of an occurrence of a position deviation of the thermal processing unit PHP.

(b) Position Deviation Detection Operation in Vertical Direction

FIGS. 18A to 18D are diagrams for explaining the position deviation detection operation in the vertical direction. Each of FIGS. 18A to 18D is a schematic cross sectional view of the transport mechanism 127 and the substrate supporter WS.

Figure 18A:
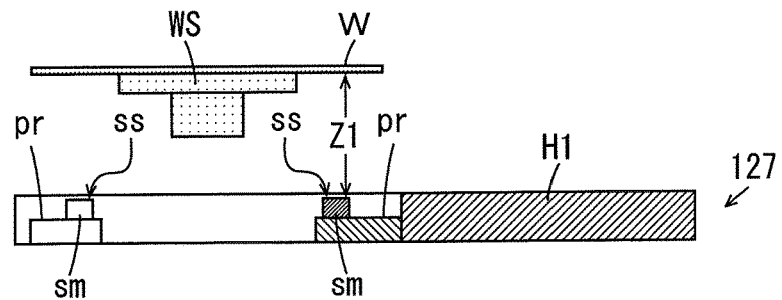
FIGS. 18A to 18D are diagrams for explaining a position deviation detection operation in the vertical direction.

The hand H1 is moved to the target height based on the target height coordinate stored in the memory 520, whereby the substrate W is transferred to the substrate supporter WS or the substrate W is received from the substrate supporter WS. Thus, the substrate W can be transferred to the substrate supporter WS by the hand H1 to be supported at the reference height, or the hand H1 can be moved towards the substrate supporter WS to receive the substrate W supported at the reference height. In the example of FIG. 18A, a distance between a suction surface ss of a suction portion sm of the hand H1 positioned at the target height and a lower surface of the substrate W supported by the substrate supporter WS at the reference height is Z1.

Figure 18B:
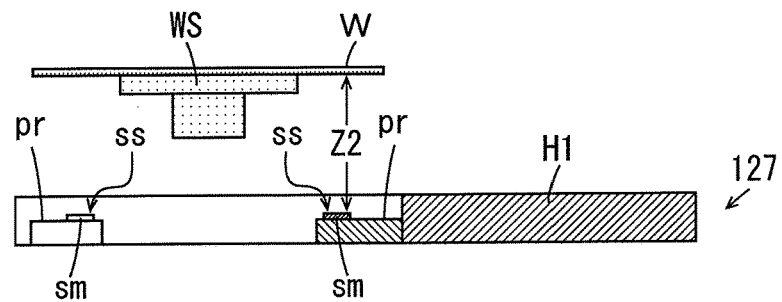

However, the suction portion sm gradually wears away by repeatedly sucking the substrate W. Therefore, as shown in FIG. 18B, in the case where the suction portion sm is used over a long period of time, the measurement of the suction portion sm in the height direction is reduced. In the example of FIG. 18B, a distance between the suction surface ss of the suction portion sm of the hand H1 positioned at the target height and the lower surface of the substrate W supported at the reference height by the substrate supporter WS is Z2. The distance Z2 is larger than the distance Z1.

Figure 18C:
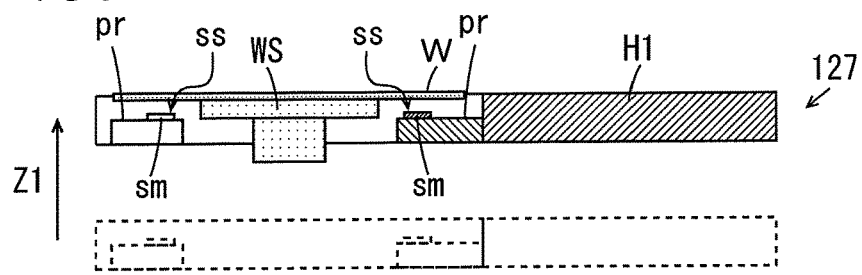

Therefore, as shown in FIG. 18C, even in the case where the hand H1 is moved upward by the distance Z1, the substrate W supported at the reference height by the substrate supporter WS cannot be received. Similarly, even in the case where the hand H1 is moved downward by the distance Z1, the substrate W cannot be transferred to the substrate supporter WS to be supported at the reference height. The distance Z1 is an offset amount stored in the memory 520 of FIG. 7.

Further, after the maintenance of the substrate processing apparatus 100 is performed, a position deviation of the substrate supporter WS in the vertical direction may occur similarly to a position deviation of the substrate supporter WS in the horizontal direction. Even in the case where the hand H1 is moved downward by the distance Z1, the substrate W sometimes cannot be transferred to the substrate supporter WS to be supported at the reference height either in this case.

Figure 18D:
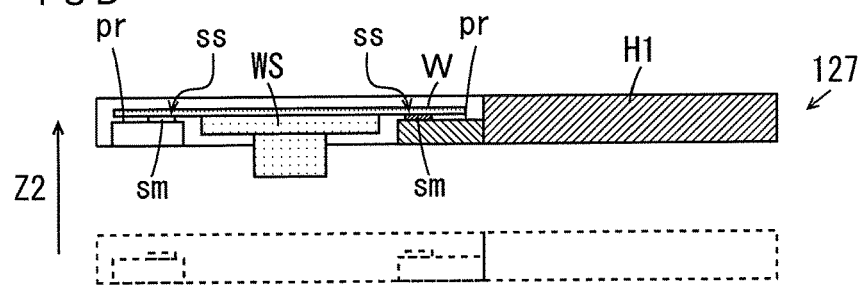

Then, as shown in FIG. 18D, during the position deviation detection operation, the hand H1 is moved upward from the target height to the height at which the suction portion sm sucks the substrate W supported at the reference height. In the example of FIG. 18D, the suction portion sm sucks the substrate W when the hand H1 is moved upward by the distance Z2.

In the case where a deviation amount between the movement distance of the hand H1 and the distance Z1 is larger than a predetermined threshold value, an alarm is output. Thus, the operator is notified of wear of the suction portion sm or an occurrence of a position deviation of the substrate supporter WS.

(c) Position Deviation Detection Processing

Figure 19:
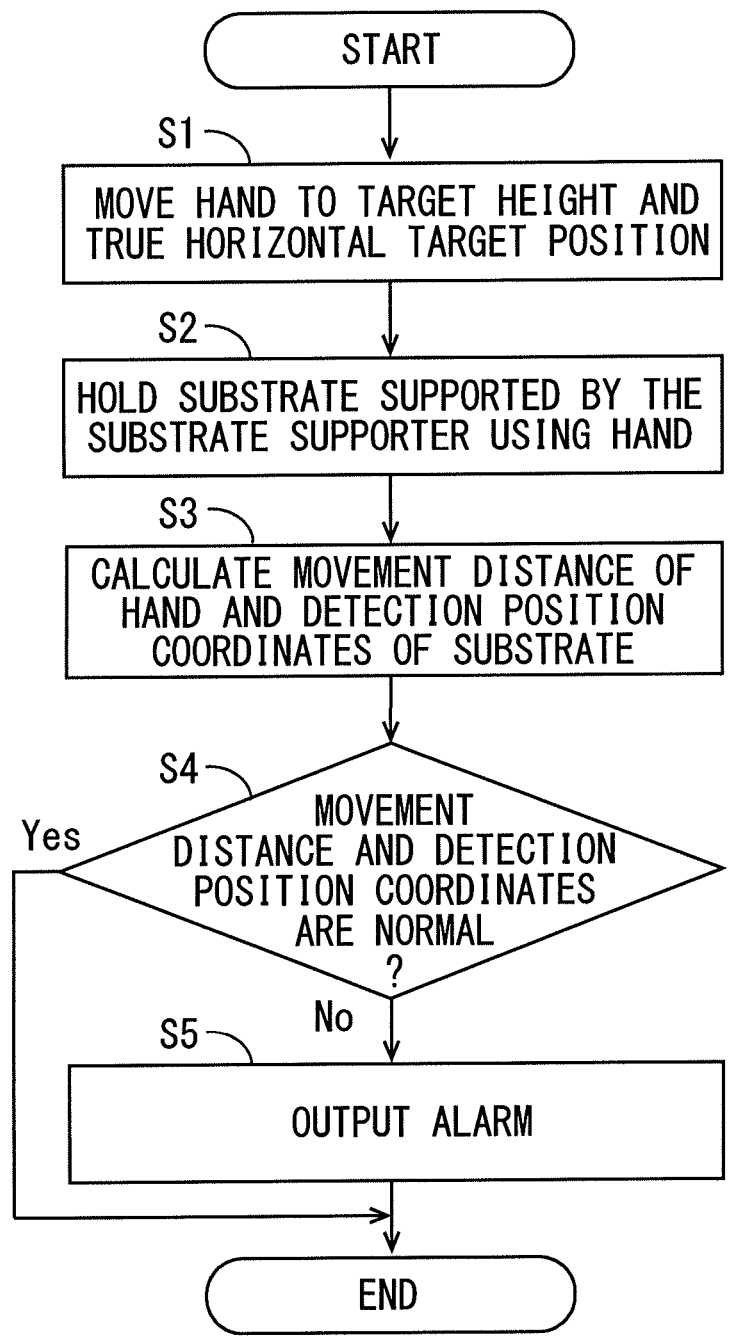
FIG. 19 is a flow chart showing one example of position deviation detection processing by a controller.

FIG. 19 is a flow chart showing one example of the position deviation detection processing by the controller 500. The position deviation detection processing of FIG. 19 is performed right after the maintenance of the substrate processing apparatus 100, for example. In the example of FIG. 19, the position deviation detection processing with the hand H1 of the transport mechanism 127 is performed.

The controller 500 moves the hand H1 to the target height and the true target position based on the target height coordinate and the correction information stored in the memory 520 (step S1). In this case, the normal position in the hand H1 coincides with the reference position in the substrate supporter WS. In this state, the controller 500 allows the hand H1 to hold the substrate W supported by the substrate supporter WS by moving the hand H1 upward (step S2).

Then, the controller 500 calculates the upward movement distance of the hand H1 until the hand H1 holds the substrate W, and the detection position coordinates of the substrate W (step S3). Next, the controller 500 determines whether the calculated movement distance and detection position coordinates are normal (step S4). Then, in the case where a deviation amount between the movement distance of the hand H1 and the offset amount stored in the memory 520 is one threshold value or less, and a deviation amount between the normal position coordinates and the detection position coordinates is another threshold value or less, the controller 500 determines that the movement distance and the detection position coordinates are normal.

In the step S4, in the case where the movement distance and the detection position coordinates are normal, the controller 500 ends the position deviation detection processing. On the other hand, in the step S4, in the case where the Z coordinate or the detection position coordinates are not normal, the controller 500 outputs an alarm (step S7). Thereafter, the controller 500 ends the position deviation detection processing.

Thus, the user can recognize whether, in the maintenance, each of the spin chucks 25, 35, 98 is attached to the driving device with the reference position deviating or each of the thermal processing sections 123, 133 is arranged at a position deviating from the regular position. Alternatively, the user can recognize that the suction portion sm has worn way due to the use of the hand H1 over a long period of time.

Figure 20:
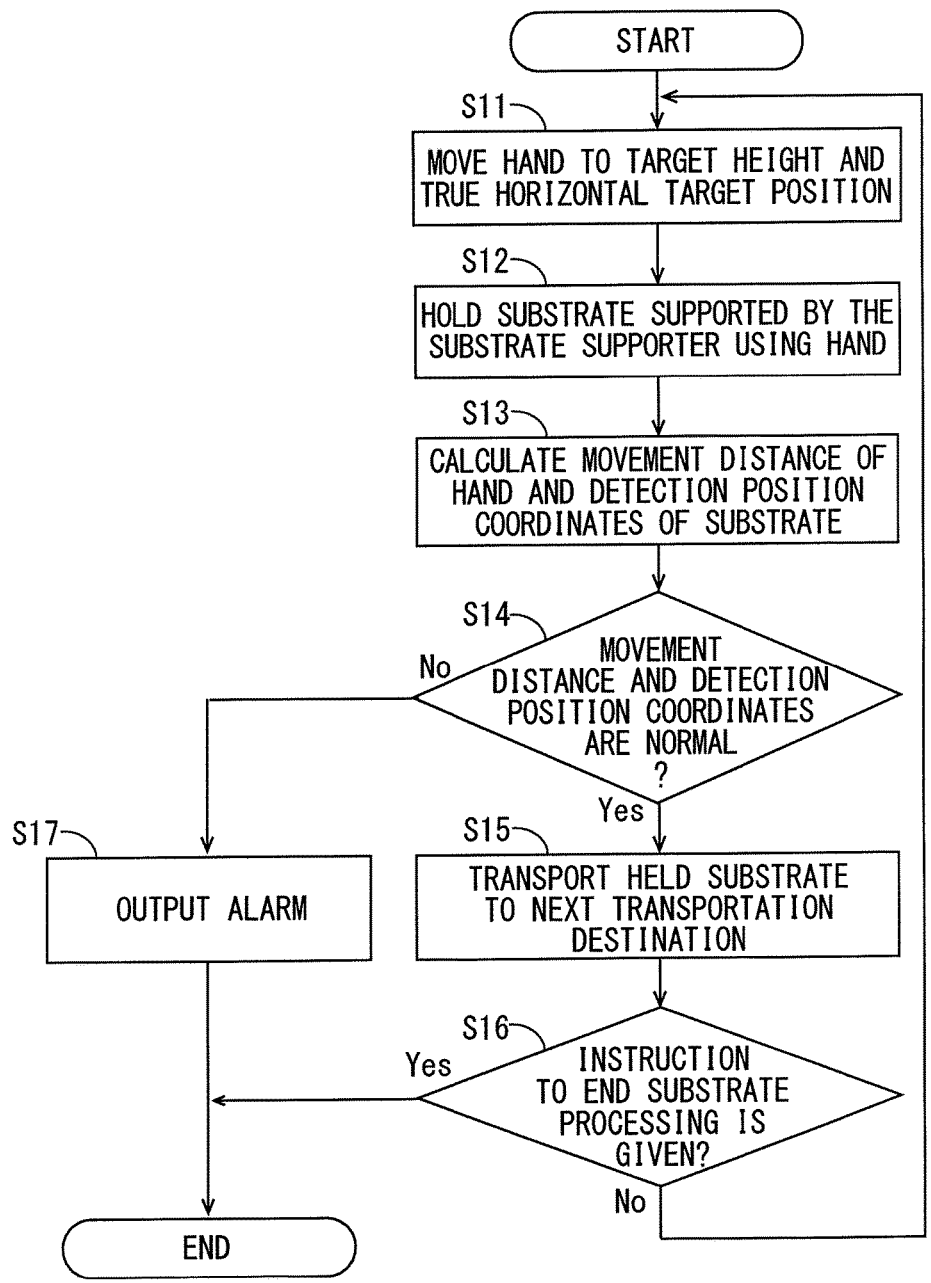
FIG. 20 is a flow chart showing another example of the position deviation detection processing by the controller.

FIG. 20 is a flow chart showing another example of the position deviation detection processing by the controller 500. The position deviation detection processing of FIG. 20 is performed concurrently with the substrate processing, for example. The processing of the steps S11 to S14 of FIG. 20 is similar to the processing of the steps S1 to S4 of FIG. 19, respectively.

In the step S14, in the case where the movement distance and the detection position coordinates are normal, the controller 500 transports the substrate W held by the hand H1 to a next transportation destination (step S15). Thereafter, the controller 500 determines whether an instruction to end the substrate processing has been given (step S16). In the step S16, in the case where the instruction to end the substrate processing is not given, the controller 500 returns to the step S11. In the step S16, in the case where the instruction to end the substrate processing is given, the controller 500 ends the position deviation detection processing.

On the other hand, in the step S14, in the case where the Z coordinate or the detection position coordinates are not normal, the controller 500 outputs an alarm (step S17). Thereafter, the controller 500 ends the position deviation detection processing.

Thus, the user can recognize an occurrence of an abnormality such as a position deviation of each of the spin chucks 25, 35, 98 or the thermal processing sections 123, 133 during the substrate processing. Alternatively, the user can recognize during the substrate processing that the suction portion sm has worn away.

(12) One Control Example of Transport Mechanism

In the transport mechanism 127, the outer periphery of the substrate W held by the hand H1 is detected by the sensor device 316. Further, the outer periphery of the substrate W held by the hand H2 is detected by the sensor device 316.

FIGS. 21A to 22C are diagrams showing one control example of the transport mechanism 127 for detecting the outer peripheries of the two substrates W held by the two hands H1, H2 by the one sensor device 316. In each of FIGS. 21A to 21E and FIGS. 22A to 22C, a positional relationship among the hands H1, H2 and one detector 316D is shown in a longitudinal cross sectional view.

In an initial state, the substrates W are not held by the hands H1, H2, respectively. Further, each of the hands H1, H2 is at the advancing retreating reference position FBP. In this case, a light receiver 316r receives the light that is emitted from a light emitter 316t and is passing inwardly of the guide Ha of each of the hands H1, H2 (see FIGS. 6A and 6B).

Figure 21A:
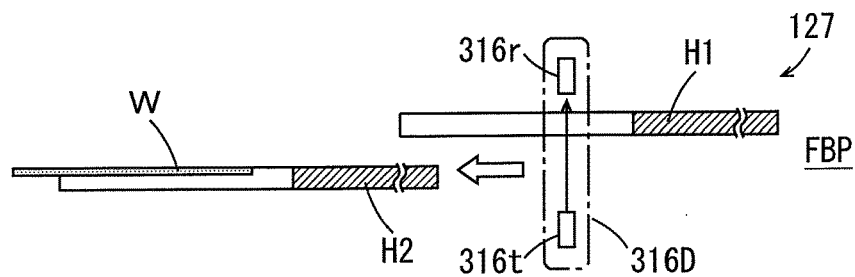
FIGS. 21A to 21E are diagrams showing one control example of the transport mechanism for detecting outer peripheries, of two substrates held by two hands, by one sensor device.

As shown in FIG. 21A, the lower hand H2 first advances to a position further forward than the detector 316D from the advancing retreating reference position and receives the substrate W arranged at a predetermined position FBP. At this time, the light receiver 316r receives the light emitted from the light emitter 316t.

Figure 21B:
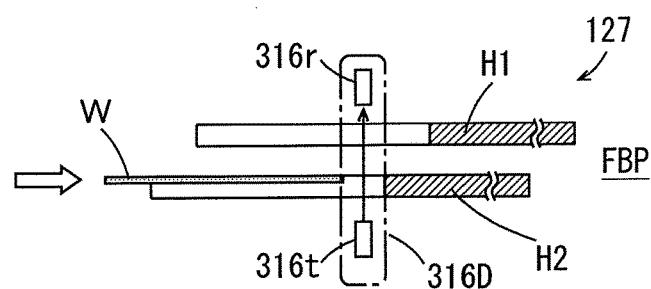
Figure 21C:
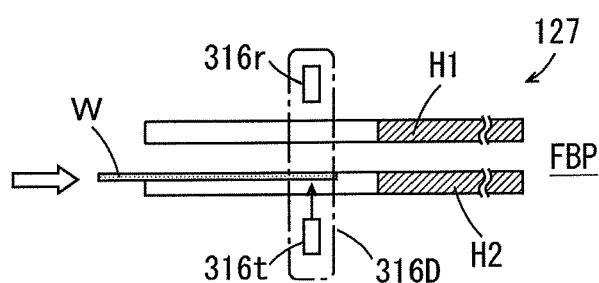

Next, the hand H2 holding the substrate W retreats towards the advancing retreating reference position FBP. In this case, as shown in FIG. 21B, during a period in which the hand H2 is moved to the advancing retreating reference position FBP, the light receiver 316r receives the light that is emitted from the light emitter 316t and passing between the outer periphery of the substrate W and the hand H2. Thereafter, when the hand H2 arrives at the advancing retreating reference position FBP, the substrate W held by the hand H2 is positioned between the light emitter 316t and the light receiver 316r. Thus, as shown in FIG. 21C, the light receiver 316r does not receive the light from the corresponding light emitter 316t.

The hand H2 is moved as described above. Thus, a plurality of portions at the outer periphery of the substrate W held by the hand H2 are detected based on light reception signals output from the light receivers 316r.

Figure 21D:
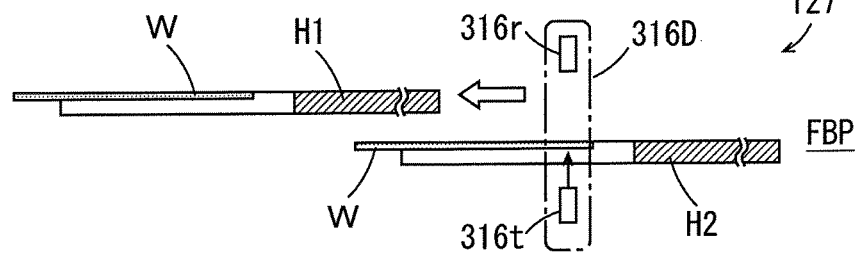

Subsequently, as shown in FIG. 21D, the upper hand H1 advances to a position further forward than the detector 316D from the advancing retreating reference position FBP and receives the substrate W arranged at a predetermined position. At this time, the light emitted from the light emitter 316t is shielded by the substrate W held by the hand H2. Therefore, the light receiver 316r does not receive the light emitted from the light emitter 316t.

Figure 21E:
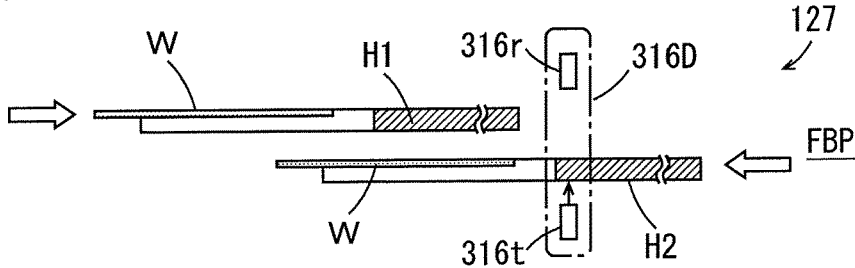
Figure 22A:
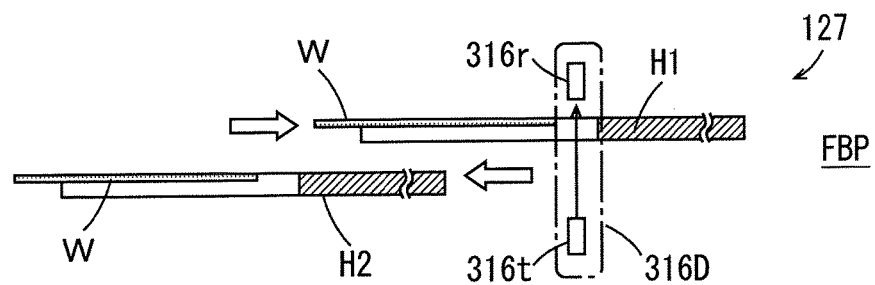
FIGS. 22A to 22C are diagrams showing the one control example of the transport mechanism for detecting the outer peripheries, of the two substrates held by the two hands, by the one sensor device.

Next, as shown in FIG. 21E, the hand H1 holding the substrate W retreats towards the advancing retreating reference position FBP, and the hand H2 holding the substrate W advances from the advancing retreating reference position FBP. Thereafter, as shown in FIG. 22A, the hand H2 is moved to a position further forward than the light emitter 316t and the light receiver 316r. In this manner, the light receiver 316r receives the light that is emitted from the light emitter 316t and is passing between the outer periphery of the substrate W and the hand H2 until the hand H1 is moved to the advancing retreating reference position FBP.

Figure 22B:
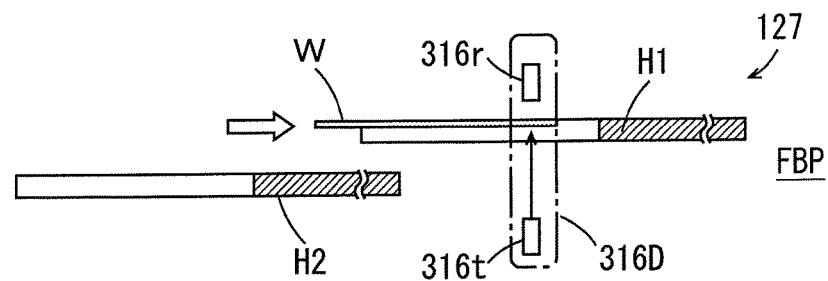

When the hand H1 is moved to the advancing retreating reference position FBP, the substrate W held by the hand H1 is positioned between the light emitter 316t and the light receiver 316r. Thus, as shown in FIG. 22B, the light receiver 316r does not receive the light from the corresponding light emitter 316t.

The hands H1, H2 move as described above. Thus, the plurality of portions at the outer periphery of the substrate W held by the hand H1 are detected based on the light reception signals output from the light receivers 316r.

Figure 22C:
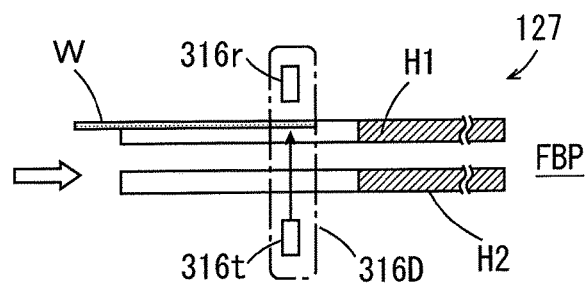

Thereafter, as shown in FIG. 22C, the substrate W held by the advancing hand H2 is placed on any substrate supporter WS, and then the hand H2 retreats to the advancing retreating reference position FBP.

As described above, in the present embodiment, the hands H1, H2 advance and retreat in opposite directions to each other, whereby the plurality of portions at the outer peripheries of the two substrates W held by the two hands H1, H2 can be detected by the one sensor device 316.

(13) Effects

In the present embodiment, during the position deviation detection operation, the hand H1 of the transport mechanism 127 is moved to the true target position in the substrate supporter WS. Thus, the substrate W supported by the substrate supporter WS at the reference position is received by the hand H1. The positional relationship between the substrate W received by the hand H1 and the hand H1 is detected by the sensor device 316. The deviation amount between the reference position and the true target position in the substrate supporter WS is acquired based on the detected positional relationship. An alarm is output in the case where the acquired deviation amount is larger than the predetermined threshold value.

Further, during the position deviation detection operation, the hand H1 of the transport mechanism 127 is lifted from the target height lower than the substrate W supported at the reference height by the substrate supporter WS. Thus, it is detected that the suction surface ss of the suction portion sm of the hand H1 has sucked the lower surface of the substrate W. The height of the hand H1 at a time point of detection of the substrate W is acquired. The deviation amount in distance between the suction surface ss in the case where the hand H1 is positioned at the target height and the reference height is acquired based on the acquired height. An alarm is output in the case where the acquired deviation amount is larger than the threshold value.

In this configuration, an alarm is output in the case where a position deviation of the substrate supporter WS has occurred after the maintenance of the substrate processing apparatus 100 and the like. Further, an alarm is output in the case where the thickness of the suction portion sm is reduced due to wear of the suction surface ss of the suction portion sm. Thus, the operator is notified of an occurrence of the position deviation of the substrate supporter WS or wear of the suction surface ss of the suction portion sm. As a result, the substrate processing is prevented from being performed with a position deviation of the substrate supporter WS present, and the substrate W is prevented from being transported with the suction surface ss of the suction portion sm worn away.

(14) Other Embodiments (a) While the correction information about each of the hands H1, H2 is independently acquired by the above-mentioned method in the above-mentioned embodiment, the present invention is not limited to this. The correction information about one hand may be acquired by the above-mentioned method, and the correction information about the other hand may be acquired based on the correction information about the one hand.

FIGS. 23A to 23C are diagrams for explaining steps of acquiring the correction information about the other hand in another embodiment. Each of FIGS. 23A to 23C shows a schematic plan view of the transport mechanism 127 and the substrate supporter WS. While the hands H1, H2 are provided to overlap with each other in the vertical direction, the hands H1, H2 that are arranged in the horizontal direction are shown in the examples of FIGS. 23A to 23C in order to facilitate understanding. In the examples of FIGS. 23A to 23C, it is considered that the correction information about the hand H2 is acquired based on the correction information about the hand H1.

First, as shown in FIG. 23A, the transport mechanism 127 holds the substrate W using the hand H1 at the normal position. The coordinates of the center of the substrate W in the hand H1 are calculated. The calculated coordinates of the center of the substrate W in the hand H1 are (X3, Y3). Next, as shown in FIG. 23B, the hand H1 transports the substrate W to the substrate supporter WS. The substrate supporter WS holds the substrate W with the center of the substrate W coinciding with the tentative target position. The tentative target position coordinates in the substrate supporter WS corresponding to the hand H1 are (Xb3, Yb3).

Thereafter, as shown in FIG. 23C, the hand H2 takes out the substrate W from the substrate supporter WS. The tentative target position coordinates in the substrate supporter WS corresponding to the hand H2 are (Xb4, Yb4). Because the tentative target position corresponding to the hand H1 and the tentative target position corresponding to the hand H2 are different from each other, the hand H2 holds the substrate W at a position different from the normal position in FIG. 23C. The coordinates of the center of the substrate W in the hand H2 are calculated. The calculated coordinates of the center of the substrate W in the hand H2 are (X4, Y4).

The controller 500 calculates the deviation between the coordinates (X3, Y3) of the center of the substrate W in the hand H1 and the coordinates (X4, Y4) of the center of the substrate W in the hand H2. Further, the controller 500 calculates the correction information about the hand H2 based on the calculated deviation and the correction information about the hand H1. The correction information about the hand H2 is stored in the memory 520 of the controller 500.

The controller 500 determines the target height of the hand H2 by the similar steps based on a deviation between reference heights of the hands H1, H2 and the target height of the hand H1. The determined target height coordinate is stored in the memory 520 of the controller 500.

(b) In the above-mentioned embodiment, in the case where the substrate supporter WS is provided in the thermal processing unit PHP, the position of the center of the substrate W guided by the plurality of guide members 436 of the transport mechanism 430 is the reference position. However, the present invention is not limited to this. In the case where the transport mechanism 430 is not provided in the thermal processing unit PHP, the position of the center of the substrate W guided by the plurality of guide members 423 in the heater 420 may be the reference position.

(c) While the substrate W is rotated by 180° by the spin chuck 25 during the teaching operation of FIGS. 15A to 15D in the above-mentioned embodiment, the present invention is not limited to this. The substrate W may be rotated by the spin chuck 25 by an arbitrary angle during the teaching operation of FIGS. 15A to 15D. In this case, a deviation of the reference position coordinates from the tentative target position coordinates can be calculated based on the position of the center of the substrate W before the rotation and the position of the center of the substrate W after the rotation by geometrical calculation.

Similarly, the substrate W is rotated by 180° by the spin chuck 25 during the position deviation detection operation of FIGS. 16A to 16D. However, the invention is not limited to this. The substrate W may be rotated by an arbitrary angle by the spin chuck 25 during the position deviation detection operation of FIGS. 16A to 16D.

(15) Correspondences between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the substrate W is an example of a substrate, the substrate processing apparatus 100 is an example of a substrate processing apparatus, the substrate supporter WS is an example of a substrate supporter, and the hand H1 is an example of a holder. The transport mechanisms 127, 128, 137, 138 are examples of a transport device, the sensor device 316 is an example of a position detector, and the controller 500 is an example of a controller and the holding detector.

The coating processing unit 129, the development processing unit 139, the edge exposure unit EEW, the cooling unit CP, the thermal processing unit PHP or the adhesion reinforcement processing unit PAHP is an example of a processing unit. The guide members 423, 436 are examples of a guide mechanism, the suction surface ss is an example of a holding surface, and the suction portion sm is an example of a suction portion.

As each of constituent elements recited in the claims, various other elements having configurations or functions described in the claims can be also used.

INDUSTRIAL APPLICABILITY

The present invention can be effectively utilized for processing of various types of substrates.

The invention claimed is:

1. A substrate processing apparatus that performs processing on a substrate, comprising:
   a substrate supporter that has a preset reference position and is configured to be capable of supporting the substrate;
   a transporter that has a holder configured to hold the substrate and transports the substrate by moving the holder;
   a position detector that detects a positional relationship between the substrate held by the holder and the holder; and
   a controller that, during substrate processing, controls the transporter to move the holder to a target position in order for the substrate to be transferred to the reference position in the substrate supporter or received from the reference position, wherein
   the controller, during a position deviation detection operation, controls the transporter to move the holder to the target position in the substrate supporter and receive the substrate supported by the substrate supporter, acquires a deviation amount between the reference position and the target position based on the positional relationship detected by the position detector, and outputs an alarm in the case where the acquired deviation amount is larger than a predetermined first threshold value.

2. The substrate processing apparatus according to claim 1, wherein
   the substrate supporter is configured to hold the substrate in a horizontal attitude and be rotatable about the reference position, and
   the controller, during the position deviation detection operation, controls the transporter to move the holder to the target position and transfer the substrate to the substrate supporter, controls the substrate supporter such that the substrate supported by the substrate supporter is rotated by a first angle, controls the transporter to move the holder to the target position and receive the substrate supported by the substrate supporter, and acquires the reference position based on a positional relationship between the holder and the substrate before the substrate is transferred to the substrate supporter and a positional relationship between the holder and the substrate after the substrate is received from the substrate supporter.

3. The substrate processing apparatus according to claim 2, wherein
the controller, during a teaching operation relating to the transporter, controls the transporter to move the holder to an initial position in the substrate supporter and transfer the substrate to the substrate supporter, controls the substrate supporter such that the substrate supported by the substrate supporter is rotated by a second angle, controls the transporter to move the holder to the initial position and receive the substrate supported by the substrate supporter, acquires a deviation amount between the initial position and the reference position as correction information based on a positional relationship between the holder and the substrate before the substrate is transferred to the substrate supporter, and a positional relationship between the holder and the substrate after the substrate is received from the substrate supporter, corrects the initial position based on the acquired correction information such that the initial position coincides with the reference position, and acquires a corrected initial position as the target position.

4. The substrate processing apparatus according to claim 2, further comprising a substrate processor that includes the substrate supporter and performs processing on the substrate rotated by the substrate supporter during the substrate processing.

5. The substrate processing apparatus according to claim 1, wherein
the controller, during the position deviation detection operation, controls the transporter to move the holder to the target position and receive the substrate supported at the reference position in the substrate supporter, and acquires the reference position based on the positional relationship detected by the position detector.

6. The substrate processing apparatus according to claim 5, wherein
the controller, during a teaching operation relating to the transporter, controls the transporter to move the holder to an initial position in the substrate supporter and receive the substrate supported at the reference position in the substrate supporter, acquires a deviation amount between the initial position and the reference position as correction information based on the positional relationship detected by the position detector, corrects the initial position based on the acquired correction information such that the initial position coincides with the reference position, and acquires a corrected initial position as the target position.

7. The substrate processing apparatus according to claim 6, wherein
the substrate supporter includes a guide that guides the substrate to the reference position, and the substrate is guided to the reference position in the substrate supporter by the guide during the teaching operation.

8. The substrate processing apparatus according to claim 5, further comprising a substrate processor that includes the substrate supporter and performs processing on the substrate supported by the substrate supporter during the substrate processing, wherein
the target position is set in the substrate processor, and
the controller controls the transporter to move the holder to the target position in the substrate processor and receive the substrate supported at the reference position in the substrate processor.

9. The substrate processing apparatus according to claim 1, wherein
the holder of the transporter has a holding surface for holding a lower surface of the substrate,
the substrate processing apparatus further includes a holding detector detecting that the holding surface of the holder has held the lower surface of the substrate, and
the controller, during the position deviation detection operation, controls the transporter to lift the holder from a target height lower than the substrate supported by the substrate supporter at a reference height, acquires a height of the holder at a time point of detection by the holding detector, acquires a deviation amount in distance between the holding surface in the case where the holder is positioned at the target height and the reference height based on the acquired height, and outputs an alarm in the case where the acquired deviation amount is larger than a second threshold value.

10. A substrate processing apparatus that performs processing on a substrate, comprising:
a substrate supporter configured to be capable of supporting the substrate;
a transporter that includes a holder having a holding surface for holding a lower surface of the substrate and transports the substrate by moving the holder;
a holding detector detecting that the holding surface of the holder has held the lower surface of the substrate; and
a controller that, during substrate processing, controls the transporter to move the holder in order for the substrate to be transferred to the substrate supporter or received from the substrate supporter, wherein
the controller, during a position deviation detection operation, controls the transporter to lift the holder from a target height lower than the substrate supported by the substrate supporter at a reference height, acquires a height of the holder at a time point of detection by the holding detector, acquires a deviation amount in distance between the holding surface in the case where the holder is positioned at the target height and the reference height based on the acquired height, and outputs an alarm in the case where the acquired deviation amount is larger than a threshold value.

11. The substrate processing apparatus according to claim 10, wherein
the controller, during a teaching operation relating to the transporter, controls the transporter to lift the holder from a position lower than the substrate supported by the substrate supporter at the reference height, and acquires the target height based on the height of the holder at the time point of detection by the holding detector.

12. The substrate processing apparatus according to claim 10, wherein the holder includes a sucker that sucks the lower surface of the substrate, the sucker has the holding surface, and the holding detector is configured to detect that the holding surface has held the lower surface of the substrate based on whether the substrate is sucked by the sucker.

13. A substrate processing method for performing processing on a substrate, including the steps of:

moving a holder of a transporter to a target position in order for the substrate to be transferred to a preset reference position in a substrate supporter or received from the reference position during substrate processing;

moving the holder of the transporter to the target position in the substrate supporter and receiving the substrate supported by the substrate supporter at the reference position, during a position deviation detection operation;

detecting a positional relationship between the substrate received by the holder and the holder;

acquiring a deviation amount between the reference position and the target position in the substrate supporter based on the detected positional relationship; and outputting an alarm in the case where the acquired deviation amount is larger than a predetermined threshold value.

14. A substrate processing method for performing processing on a substrate, including the steps of:

moving a holder of a transporter in order for the substrate to be transferred to a substrate supporter and received from the substrate supporter during substrate processing;

lifting the holder of the transporter from a target height lower than the substrate supported by the substrate supporter at a reference height during a position deviation detection operation;

detecting that a holding surface of the holder has held a lower surface of the substrate;

acquiring a height of the holder at a time point of detection of the substrate;

acquiring a deviation amount in distance between the holding surface in the case where the holder is positioned at the target height and the reference height based on the acquired height; and outputting an alarm in the case where the acquired deviation amount is larger than a threshold value.

* * * * *